(12) United States Patent
Kim et al.

(10) Patent No.: US 10,224,513 B2
(45) Date of Patent: Mar. 5, 2019

(54) ORGANIC LIGHT EMITTING DISPLAY DEVICE

(71) Applicant: Samsung Display Co., Ltd., Yongin-si, Gyeonggi-Do (KR)

(72) Inventors: Min-Soo Kim, Seoul (KR); Ho-Jin Yoon, Hwaseong-si (KR); Mu-Gyeom Kim, Hwaseong-si (KR); Byoung-Ki Kim, Seoul (KR); Valeriy Prushinskiy, Hwaseong-si (KR); Dae-Woo Lee, Hwaseong-si (KR); Yun-Mo Chung, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/971,329

(22) Filed: May 4, 2018

(65) Prior Publication Data
US 2018/0254437 A1    Sep. 6, 2018

Related U.S. Application Data

(62) Division of application No. 15/245,791, filed on Aug. 24, 2016, now Pat. No. 9,991,474.

(30) Foreign Application Priority Data

Oct. 7, 2015 (KR) .......................... 10-2015-0141030

(51) Int. Cl.
*H01L 27/32* (2006.01)
*H01L 51/52* (2006.01)

(52) U.S. Cl.
CPC ........ *H01L 51/5271* (2013.01); *H01L 27/322* (2013.01); *H01L 27/326* (2013.01)

(58) Field of Classification Search
CPC .. H01L 51/5271; H01L 27/322; H01L 27/326
See application file for complete search history.

(56) References Cited

U.S. PATENT DOCUMENTS 8,933,625 B2    1/2015 Chung et al.

FOREIGN PATENT DOCUMENTS

| KR | 2003-0081156 A | 10/2003 |
|---|---|---|
| KR | 10-1113663 B1 | 2/2012 |
| KR | 2014-0073216 A | 6/2014 |
| KR | 2014-0122132 A | 10/2014 |
| KR | 2014-0135355 A | 11/2014 |

*Primary Examiner* — Douglas Menz
(74) *Attorney, Agent, or Firm* — Innovation Counsel LLP

(57) ABSTRACT

An organic light emitting display device includes a first substrate, a pixel structure, a second substrate, a reflective member, and a light transmitting member. The first substrate includes a plurality of pixel regions. Each of the pixel regions has sub-pixel regions and a reflective region surrounding the sub-pixel regions. The pixel structure is disposed in each of the sub-pixel regions on the first substrate. The second substrate is disposed on the pixel structure. The reflective member has an opening disposed in each of the sub-pixel regions, and is disposed in the reflective region of the second substrate. The light transmitting member covers the opening of the reflective member and partially overlaps the reflective member. The light transmitting member blocks ultraviolet rays and transmits a predetermined light.

4 Claims, 19 Drawing Sheets

ORGANIC LIGHT EMITTING DISPLAY DEVICE

CROSS-REFERENCE TO RELATED APPLICATION(S)

This application is a divisional application of U.S. patent application Ser. No. 15/245,791 filed Aug. 24, 2016, which claims priority under 35 USC § 119 to Korean Patent Applications No. 10-2015-0141030, filed on Oct. 7, 2015 in the Korean Intellectual Property Office (KIPO), the contents of which are incorporated herein in its entirety by reference.

BACKGROUND

1. Field

Example embodiments relate generally to organic light emitting display devices. More particularly, embodiments of the present inventive concept relate to organic light emitting display devices having a reflective member.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby a light of a certain wavelength can be emitted.

Recently, a mirror OLED device capable of reflecting an image of an object (or target) that is disposed in the front of the OLED device by including a reflective region and a pixel region has been developed. In this case, since a reflective member is disposed in the front of the OLED device, a polarizer capable of blocking ultraviolet (UV) rays may not be used. Thus, an organic light emitting layer included in the OLED device may not be protected from the UV rays. In addition, a size of the reflective member may be manufactured less than a size of the organic light emitting layer because of a scattering phenomenon of light. Accordingly, an opening ratio of the OLED device may be decreased. Further, a metal layer preventing a diffraction of light may be added due to a diffraction phenomenon of light, and thus a transmissivity of the OLED device may be decreased.

SUMMARY

Some example embodiments provide an organic light emitting display device including a reflective member and a light transmitting member.

According to one aspect of example embodiments, an organic light emitting display device includes a first substrate, a pixel structure, a second substrate, a reflective member, and a light transmitting member. The first substrate includes a plurality of pixel regions. Each of the pixel regions has sub-pixel regions and a reflective region surrounding the sub-pixel regions. The pixel structure is disposed in each of the sub-pixel regions on the first substrate. The second substrate is disposed on the pixel structure. The reflective member has an opening disposed in each of the sub-pixel regions, and is disposed in the reflective region of the second substrate. The light transmitting member covers the opening of the reflective member and partially overlaps the reflective member. The light transmitting member transmits a predetermined light.

In example embodiments, the reflective member may include a first surface in contact with the second substrate and a second surface opposite to the first surface. Opposite side portions of the light transmitting member may be disposed on the second surface of the reflective member surrounding the light transmitting member such that the light transmitting member overlaps at least a portion of the reflective member.

In example embodiments, the reflective member may include a first surface in contact with the second substrate and a second surface opposite to the first surface. Adjacent two light transmitting members among the light transmitting members disposed in the sub-pixel regions may be contacted to each other on the second surface of the reflective member to completely cover the second surface of the reflective member.

In example embodiments, the reflective member may include a first surface facing the second substrate and a second surface opposite to the first surface. Adjacent two light transmitting members among the light transmitting members disposed in the sub-pixel regions may be contacted to each other between the first surface of the light transmitting member and the second substrate such that the first surface of the reflective member is spaced apart from the second substrate.

In example embodiments, the adjacent two light transmitting members may be overlapped between the first surface of the reflective member and the second substrate.

In example embodiments, a color of the overlapped two light transmitting members may be different from each other.

In example embodiments, a thickness of the overlapped two light transmitting members between the first surface of the reflective member and the second substrate may be the same to each other.

In example embodiments, a thickness of the overlapped two light transmitting members between the first surface of the reflective member and the second substrate may be different from each other.

In example embodiments, the reflective member may include a first surface facing the second substrate and a second surface opposite to the first surface. A first side of the light transmitting member may be disposed on the second surface of the reflective member such that the light transmitting member overlaps at least a portion of the reflective member surrounding the light transmitting member, and a second side of the light transmitting member may be interposed between the first surface of the reflective member and the second substrate.

In example embodiments, the openings of the reflective member may include first through (N)th openings, where N is an integer greater than 1. The reflective member may be separated by the openings, and the light transmitting member may be disposed in a (K)th opening among the first through (N)th openings and at least a portion of the reflective member surrounding the (K)th opening, where K is an integer between 1 and N.

In example embodiments, the OLED device may further include a transflective layer interposed between the second substrate and the reflective and light transmitting members. The transflective layer may be disposed in the sub-pixel region and the reflective region on the second substrate. A thickness of the transflective layer may be less than a thickness of the reflective member. A light transmissivity of the transflective layer may be greater than a light transmissivity of the reflective member.

In example embodiments, the second substrate may include at least one inorganic layer and at least one organic layer. The inorganic layer and the organic layer may be alternately disposed on the pixel structure. The reflective member may be disposed in the reflective region on the second substrate.

In example embodiments, the light transmitting member may block ultraviolet rays, and includes a material having a predetermined color.

In example embodiments, the pixel structure may include a lower electrode on the first substrate, a light emitting layer on the lower electrode, and an upper electrode on the light emitting layer. Light emitted in the light emitting layer may transmit the light transmitting member, and the light emitting layer and the light transmitting member disposed on the light emitting layer may have the same color.

In example embodiments, the opening of the reflective member may expose the light emitting layer, when viewed from a direction substantially perpendicular to an upper surface of the second substrate. A size of the opening of the reflective member may be greater than a size of the light emitting layer.

In example embodiments, the light transmitting member may overlap the sub-pixel region and at least a portion of the reflective region, and the reflective member may have a mesh structure defined by a plurality of openings.

According to one aspect of example embodiments, an organic light emitting display device includes a first substrate, a pixel structure, a second substrate, a reflective member, and a color layer. The first substrate includes a plurality of pixel regions. Each of the pixel regions has sub-pixel regions and a reflective region surrounding the sub-pixel regions. The pixel structure is disposed in each of the sub-pixel regions on the first substrate. The second substrate is disposed on the pixel structure. The reflective member has an opening disposed in each of the sub-pixel regions, and is disposed in the reflective region of the second substrate. The color layer is disposed between the reflective member and the second substrate, and has a predetermined color.

In example embodiments, the OLED device may further include a transflective layer covering the second substrate and the reflective member. The transflective layer may be disposed in the sub-pixel region and the reflective region on the second substrate. A thickness of the transflective layer may be less than a thickness of the reflective member, and a light transmissivity of the transflective member may be greater than a light transmissivity of the reflective member.

In example embodiments, the reflective region included in a plurality of the pixel regions may include a first reflective region and a second reflective region that is adjacent to the first reflective region. A color layer may be disposed in the first reflective region, and may no bet disposed in the second reflective region.

In example embodiments, the reflective region included in a plurality of the pixel regions may include a first reflective region and a second reflective region that is adjacent to the first reflective region, and the color layer may include a first color layer and a second color layer that is different from a color of the first color layer. A first color layer may be disposed in the first reflective region, and the second color layer may be disposed in the second reflective region.

As an organic light emitting display device according to example embodiments includes a reflective member and a light transmitting member, the organic light emitting display device may protect an organic light emitting layer from ultraviolet rays, and may relatively increase an opening ratio. In addition, as a reflective member overlaps a light transmitting member, the reflective member may have various colors.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Hereinafter, embodiments of the present inventive concept will be explained in detail with reference to the accompanying drawings.

Figure 1:
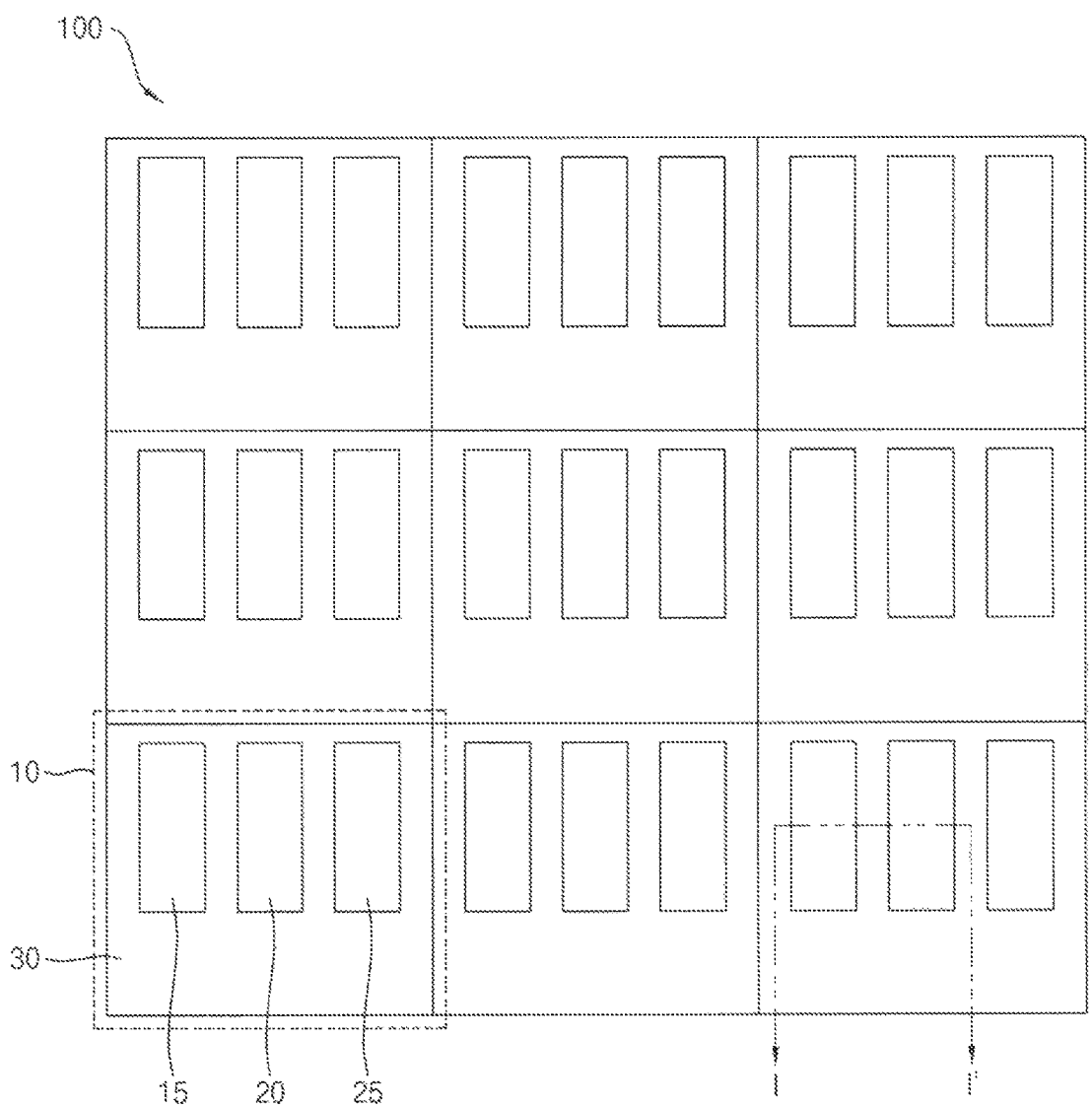
FIG. 1 is a planar view illustrating an organic light emitting display (OLED) device in accordance with example embodiments.

FIG. 1 is a planar view illustrating an organic light emitting display (OLED) device in accordance with example embodiments.

Referring to FIG. 1, an organic light emitting display (OLED) device 100 may include a plurality of pixel regions. One pixel region 10 may have first through three sub-pixel regions 15, 20, and 25 and a reflective member 30. For example, each of a plurality of the pixel regions may include the first through three sub-pixel regions 15, 20, and 25 and the reflective region 30. The reflective region 30 may substantially surround the first through three sub-pixel regions 15, 20, and 25.

First through three sub-pixels are disposed in the first through three sub-pixel regions 15, 20, and 25, respectively. For example, the first sub-pixel may emit a red color of light, and the second sub-pixel may emit a green color of light. In addition, the third sub-pixel may emit a blue color of light. The first through three sub-pixels may be disposed at the same level on the substrate.

In the reflective region 30, a reflective member may be disposed. For example, the reflective member may reflect an external light, and may have a mesh structure including a plurality of openings. For example, the reflective member may include openings that are disposed in each of the first through three sub-pixel regions 15, 20, and 25. A size of each of the first through three sub-pixel regions 15, 20, and 25 may be substantially the same as that of each of the openings of the reflective member. However, a size of each of the first through three sub-pixels disposed in each of the first through three sub-pixel regions 15, 20, and 25 may be less than that of each of the openings of the reflective member 30. For example, the sub-pixel and at least a portion of a pixel defining layer surrounding the sub-pixel may be disposed in the sub-pixel region. Accordingly, the opening of the reflective member may expose the sub-pixel, and a size of the opening of the reflective member may be greater than that of the sub-pixel. In example embodiments, the opening may include first through (N)th openings, where N is integer greater than 1, and the reflective member may be spatially separated by the openings in one direction. Here, the light transmitting member may be disposed in a (K)th opening among the first through (N)th openings and at least a portion of the reflective member surrounding the (K)th opening, where K is an integer between 1 and N. The light transmitting member that overlaps the opening of the reflective member and at least a portion of the reflective member (e.g., partially overlapped) may be disposed. For example, the light transmitting member may partially overlap the first through three sub-pixel regions 15, 20, and 25 and at least a portion of the reflective region 30.

Figure 2:
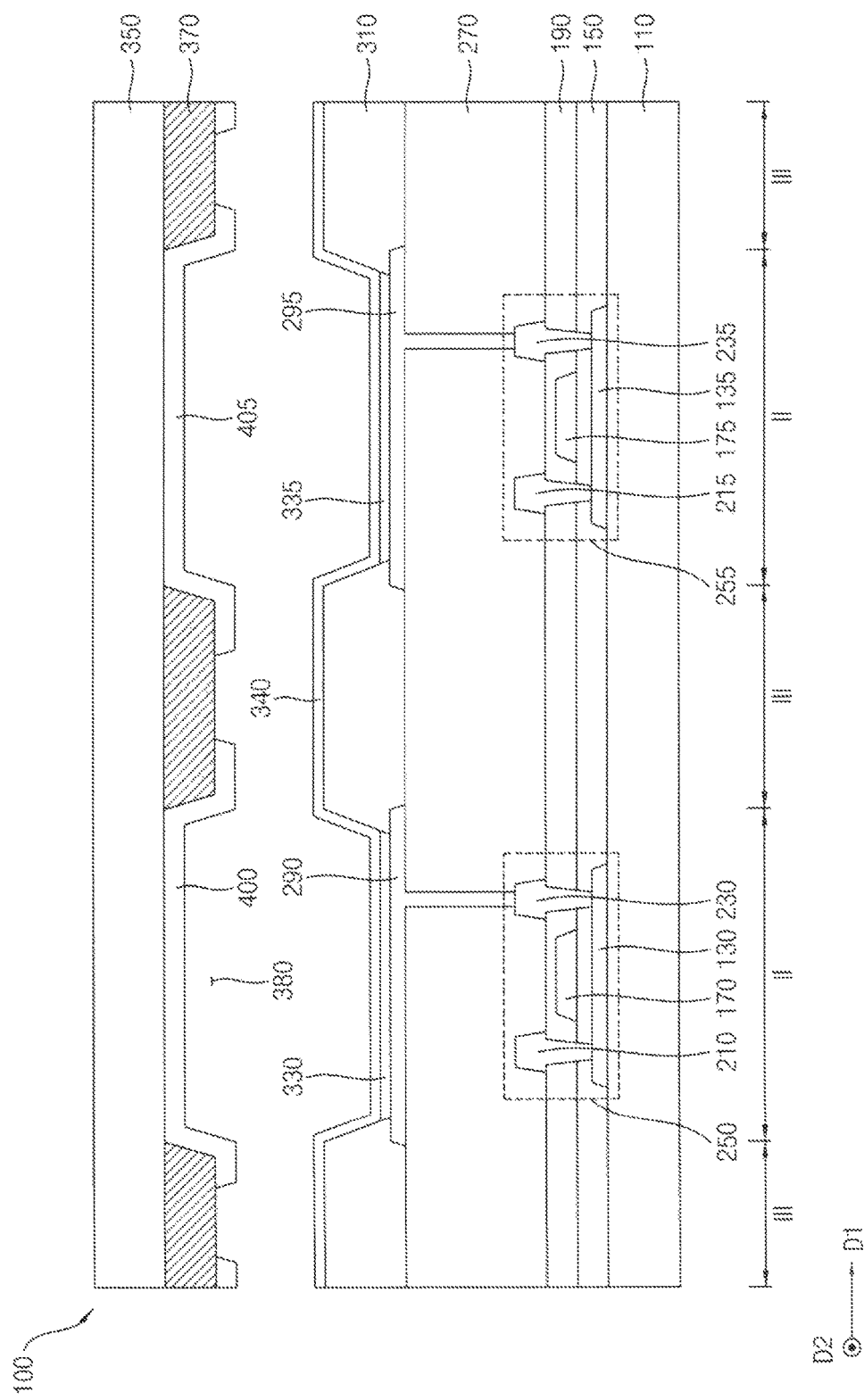
FIG. 2 is a cross-sectional view taken along a line I-I' of FIG. 1.

FIG. 2 is a cross-sectional view taken along a line I-I' of FIG. 1.

Referring to FIG. 2, an organic light emitting display (OLED) device 100 may include a first substrate 110, first and second semiconductor elements 250 and 255, a gate insulating layer 150, an insulating interlayer 190, a planarization layer 270, first and second pixel structures, a pixel defining layer 310, a second substrate 350, a reflective member 370, first and second light transmitting members 400 and 405, etc. Here, each of the first and second pixel structures may include first and second lower electrodes 290 and 295, first and second light emitting layers 330 and 335, respectively, and an upper electrode 340. Each of the first and second semiconductor elements 250 and 255 may include first and second active layers 130 and 135, first and second gate electrodes 170 and 175, first and second source electrodes 210 and 215, and first and second drain electrodes 230 and 235, respectively.

As described above, the OLED device 100 may include a plurality of pixel regions. One pixel region among a plurality of the pixel regions may have a sub-pixel region II and a reflective region III. The first and second semiconductor elements 250 and 255, the first and second lower electrodes 290 and 295, the first and second light emitting layers 330 and 335, etc may be disposed in the sub-pixel region II. The pixel defining layer 310, the reflective member 370, etc may be disposed in the reflective region III. In example embodiments, each of the first and second light transmitting members 400 and 405 may be disposed in the sub-pixel region II and at least a portion of the reflective region III. In addition, each of the first and second light transmitting members 400 and 405 may transmit a predetermined light, and may block ultraviolet (UV) rays. Further, each of the first and second light transmitting members 400 and 405 may have a predetermined color.

For example, a display image may be displayed in the sub-pixel region II, and an image of an object that is disposed in the front of the OLED device 100 may be reflected in the reflective region III. As the OLED device 100 includes the reflective member 370 and the first and second light transmitting members 400 and 405, the OLED device 100 may serve as a mirror display device.

The first and second semiconductor elements 250 and 255 and the first and second pixel structures may be disposed on the first substrate 110. The first substrate 110 may be formed of opaque materials or transparent materials. For example, the first substrate 110 may include a quartz substrate, a synthetic quartz substrate, a calcium fluoride substrate, a fluoride-doping quartz substrate, a sodalime substrate, a non-alkali substrate etc. Alternatively, the first substrate 110 may be formed of a flexible transparent material such as a flexible transparent resin substrate (e.g., a polyimide substrate).

For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of the first and second semiconductor elements 250 and 255 and the pixel structures. That is, the first substrate 110 may have a structure in which the first polyimide layer, the barrier film layer and the second polyimide layer are stacked on the rigid glass substrate. In a manufacturing the OLED device 100, after an insulating layer is provided on the second polyimide layer of the polyimide substrate, the first and second semiconductor elements 250 and 255 and the pixel structures may be disposed on the insulating layer. After the first and second semiconductor elements 250 and 255 and the pixel structures are formed on the insulating layer, the rigid glass substrate under which the polyimide substrate is disposed may be removed. It may be difficult to directly form the first and second semiconductor elements 250 and 255 and the pixel structures on the polyimide substrate because the polyimide substrate is relatively thin and flexible. Accordingly, the first and second semiconductor elements 250 and 255 and the pixel structures are formed on the polyimide substrate and the rigid glass substrate, and then the polyimide substrate may serve as the first substrate 110 of the OLED device 100 after the removal of the rigid glass substrate. As OLED device 100 includes the sub-pixel region II and the reflective region III, the first substrate 110 may be divided into the sub-pixel region II and the reflective region III.

A buffer layer (not shown) may be disposed on the first substrate 110. The buffer layer may be disposed on the entire first substrate 110. The buffer layer may prevent the diffusion of metal atoms and/or impurities from the first substrate 110. Additionally, the buffer layer may control a rate of a heat transfer in a crystallization process for forming the first and second active layers 130 and 135, thereby obtaining substantially uniform the first and second active layers 130 and 135. Furthermore, the buffer layer may improve a surface flatness of the first substrate 110 when a surface of the first substrate 110 is relatively uneven. According to a type of the first substrate 110, at least two buffer layers may be provided on the first substrate 110, or the buffer layer may not be disposed. For example, the buffer layer may include silicon oxide, silicon nitride, silicon oxynitride, etc.

Each of the first and second semiconductor elements 250 and 255 may be formed of each of the first and second active layers 130 and 135, the first and second gate electrodes 170 and 175, the first and second source electrodes 210 and 215, and the first and second drain electrodes 230 and 235. For example, the first and second active layers 130 and 135 may be disposed spacing apart from each other by a predetermined distance on the first substrate 110. The first and second active layers 130 and 135 may be formed of an oxide semiconductor, an inorganic semiconductor (e.g., amorphous silicon, polysilicon, etc.), an organic semiconductor, etc.

The gate insulating layer 150 may be disposed on the first and second active layers 130 and 135. The gate insulating layer 150 may cover the first and second active layers 130 and 135 in the sub-pixel region II, and may extend on the first substrate 110 in a first direction from the sub-pixel region II into the reflective region III. That is, the gate insulating layer 150 may be disposed on the entire first substrate 110. In example embodiments, the gate insulating layer 150 may sufficiently cover the first and second active layers 130 and 135. The gate insulating layer 150 may have a substantially even surface without a step around the first and second active layers 130 and 135. Alternatively, the gate insulating layer 150 may cover the first and second active layers 130 and 135, and may be disposed as a substantially uniform thickness along a profile of the first and second active layers 130 and 135. The gate insulating layer 150 may include a silicon compound, a metal oxide, etc. For example, the gate insulating layer 150 may be formed of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

Each of the first and second gate electrodes 170 and 175 may be disposed on a portion of the gate insulating layer 150 under which each of the first and second active layers 130 and 135 is disposed to overlap the first and second active layers 130 and 135 in a plan view. The first and second gate electrodes 170 and 175 may be formed of a metal, a metal alloy, metal nitride, conductive metal oxide, transparent conductive materials, etc. For example, each of the first and second gate electrodes 170 and 175 may include aluminum (Al), an alloy of aluminum, aluminum nitride (AlNx), silver (Ag), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof.

The insulating interlayer 190 may be disposed on the first and second gate electrodes 170 and 175. The insulating interlayer 190 may cover the first and second gate electrodes 170 and 175 in the sub-pixel region II, and may extend in the first direction on the gate insulating layer 150. That is, the insulating interlayer 190 may be disposed on the entire first substrate 110. In example embodiments, the insulating interlayer 190 may sufficiently cover the first and second gate electrodes 170 and 175. The insulating interlayer 190 may have a substantially even surface without a step around the first and second gate electrodes 170 and 175. Alternatively, the insulating interlayer 190 may cover the first and second gate electrodes 170 and 175, and may be disposed as a substantially uniform thickness along a profile of the first and second gate electrodes 170 and 175. The insulating interlayer 190 may include a silicon compound, a metal oxide, etc.

The first and second source electrodes 210 and 215 and the first and second drain electrodes 230 and 235 may be disposed on the insulating interlayer 190. Each of the first and second source electrodes 210 and 215 may be in contact with a first side of each of the first and second active layers 130 and 135 via a contact hole formed by removing a portion of the gate insulating layer 150 and the insulating interlayer 190. Each of the first and second drain electrodes 230 and 235 may be in contact with a second side of each of the first and second active layers 130 and 135 via a contact hole formed by removing a portion of the gate insulating layer 150 and the insulating interlayer 190. Each of the first and second source electrodes 210 and 215 and each of the first and second drain electrodes 230 and 235 may be formed of a metal, an alloy, metal nitride, conductive metal oxide, transparent conductive materials, etc. Accordingly, in the sub-pixel region II, the first semiconductor element 250 including the first active layer 130, the first gate electrode 170, the first source electrode 210, and the first drain electrode 230 may be disposed. In addition, the second semiconductor element 255 including the second active layer 135, the second gate electrode 175, the second source electrode 215, and the second drain electrode 235 may be disposed in the sub-pixel region II.

In example embodiments, the semiconductor elements of the OLED device 100 may have a top gate structure, but not being limited thereto. In some example embodiments, for example, the semiconductor elements may have a bottom gate structure.

In addition, the semiconductor elements of the OLED device 100 may be disposed in the sub-pixel region II, but not being limited thereto. For example, the semiconductor elements may be disposed in the reflective region III.

The planarization layer 270 may be disposed on the first and second source electrodes 210 and 215 and the first and second drain electrodes 230 and 235 (e.g., on the first semiconductor element and the second semiconductor element). The planarization layer 270 may cover the first and second source electrodes 210 and 215 and the first and second drain electrodes 230 and 235 in the sub-pixel region II, and may extend along the first direction on the insulating interlayer 190. That is, the planarization layer 270 may be disposed on the entire first substrate 110 in the sub-pixel region II. For example, the planarization layer 270 may have a thickness enough to sufficiently cover the first and second source and first and second drain electrodes 210, 215, 230, and 235. In this case, the planarization layer 270 may have a substantially flat upper surface, and a planarization process may be further performed on the planarization layer 270 to implement the flat upper surface of the planarization layer 270. Alternatively, the planarization layer 270 may cover the first and second source and first and second drain electrodes 210, 215, 230, and 235, and may be disposed as a substantially uniform thickness along a profile of the first and second source and first and second drain electrodes 210, 215, 230, and 235. The planarization layer 270 may include a silicon compound, a metal oxide, a polymer, etc.

The first and second lower electrodes 290 and 295 may be disposed on the planarization layer 270. Each of the first and second lower electrodes 290 and 295 may be in contact with each of the first and second drain electrodes 230 and 235 via contact holes formed by removing portions of the planarization layer 270. In addition, each of the first and second lower electrodes 290 and 295 may be electrically connected to each of the first and second semiconductor elements 250 and 255. Each of the first and second lower electrodes 290 and 295 may be formed of a metal, a metal alloy, metal nitride, conductive metal oxide, transparent conductive materials, etc.

The pixel defining layer 310 may expose a portion of each of the first and second lower electrodes 290 and 295 in the sub-pixel region II on the planarization layer 270. The pixel defining layer 310 may include organic materials or inorganic materials. In this case, the first and second light emitting layers 330 and 335 may be disposed on the portion of each of the first and second lower electrodes 290 and 295 exposed by the pixel defining layer 310.

Each of the first and second light emitting layers 330 and 335 may be disposed in a portion where the portion of each of the first and second lower electrodes 290 and 295 is exposed. The first and second light emitting layers 330 and 335 may be formed using at least one of light emitting materials capable of generating different colors of light (e.g., a red color of light, a blue color of light, and a green color of light, etc) according to sub-pixels. Alternatively, each of the first and second light emitting layers 330 and 335 may generally generate a white color of light by stacking a plurality of light emitting materials capable of generating different colors of light such as a red color of light, a green color of light, a blue color of light, etc.

The upper electrode 340 may be disposed on the pixel defining layer 310 and the first and second light emitting layers 330 and 335. The upper electrode 340 may cover the pixel defining layer 310 and the first and second light emitting layers 330 and 335 in the sub-pixel region II and the reflective region III, and may extend in the first direction on the pixel defining layer 310 and the first and second light emitting layers 330 and 335. That is, the upper electrode 340 may overlap the first and second light emitting layers 330 and 335. The upper electrode 340 may be formed of a metal, a metal alloy, metal nitride, conductive metal oxide, transparent conductive materials, etc. These may be used alone or in a suitable combination thereof.

The reflective member 370 may be disposed in the reflective region III on the upper electrode 340. The reflective member 370 may be disposed in a lower surface of the second substrate 350. The reflective member 370 may substantially surround the sub-pixel region II, and may extend on the lower surface of the second substrate 350 in a second direction or a direction that is opposite to the second direction. Here, the second direction may be substantially perpendicular to the first direction. In addition, the reflective member 370 may include a plurality of openings. Each of the openings 380 may correspond to (e.g., overlap) the sub-pixel regions II. That is, the reflective member 370 may have a mesh structure defined by a plurality of openings 380.

The reflective member 370 may include a first surface and a second surface that is opposite to the first surface. The first surface may be in contact with the second substrate 350, and the second surface may face the upper electrode 340. A light incident through the second substrate 350 from an outside may be reflected from the first surface of the reflective member 370 (e.g., an image of an object that is disposed in the front of the OLED device 100 may be displayed on the first surface of the reflective member 370.). In addition, a light generated from the first and second light emitting layers 330 and 335 of the OLED device 100 may pass through the openings 380 disposed in the sub-pixel region II.

The reflective member 370 may include a material that has relatively high reflective index. For example, the reflective member 370 may be formed of gold (Au), Ag, Al, Pt, Ni, Ti, etc. Alternatively, the reflective member 370 may be formed of a metal, a metal alloy, metal nitride, conductive metal oxide, transparent conductive materials, etc. For example, the reflective member 370 may be formed of an alloy of aluminum, AlNx, an alloy of silver, WNx, an alloy of copper, CrNx, an alloy of molybdenum, TiNx, TaNx, SRO, ZnOx, SnOx, InOx, GaOx, ITO, IZO, etc.

In example embodiments, the reflective member 370 of the OLED device 100 may have a single layer, but not being limited thereto. In some example embodiments, the reflective member may have a multi layer structure having a plurality of layers.

Each of the first and second light transmitting members 400 and 405 may cover the opening 380 of the reflective member 370, and then may partially overlap the reflective member 370 on edges of the reflective member 370. That is, the first and second light transmitting members 400 and 405 may overlap the sub-pixel region II and the at least a portion of the reflective region III. For example, opposite side portions of each of the first and second light transmitting members 400 and 405 may be disposed on the second surface of the reflective member 370 surrounding each of the first and second light transmitting members 400 and 405 such that each of the first and second light transmitting members 400 and 405 overlaps at least a portion of the reflective member 370. Each of the first and second light transmitting members 400 and 405 may completely overlap the sub-pixel region II but partially overlap the reflective member 370 on edges of the reflective member 370. Each of the first and second light transmitting members 400 and 405 may transmit a predetermined light, and may block UV rays. In example embodiments, each of the first and second light transmitting members 400 and 405 may include a color filter. Each of the first and second light transmitting members 400 and 405 may include at least one among a red color filter, a green color filter, a blue color filter according to colors of light emitted from the first and second light emitting layers 330 and 335 of the OLED device 100. A color of each color filter of the first and second light transmitting members 400 and 405 disposed on the first and second light emitting layers 330 and 335 may be the same as that of a light generated from each of the first and second light emitting layers 330 and 335. Alternatively, each of the first and second light transmitting members 400 and 405 may include a yellow color filter, a cyan color filter, and a magenta color filter. The color filter may be formed of a photosensitive resin. In addition, the color filter capable of using as the light transmitting member may include a material capable of blocking UV rays. For example, the material blocking UV rays may include benzotriazole based compound, benzophenone based compound, cyano acrylate based compound, salicylic acid based compound, etc. Alternatively, when each of the first and second light emitting layers 330 and 335 emits a white color of light, a color of each color filter of the first and second light transmitting members 400 and 405 and a color of a light generated from each of the first and second light emitting layers 330 and 335 may be different from each other. For example, a color of each color filter of the first and second light transmitting members 400 and 405 may be one selected from a group consisting of a red color, a green color, a blue color, a yellow color, a cyan color and a magenta color.

Since the first and second light transmitting members 400 and 405 block UV rays, the first and second light emitting layers 330 and 335 may be protected from UV rays. In addition, as opposite side portions of each of the first and second light transmitting members 400 and 405 are disposed on the second surface of the reflective member 370, a diffused reflection generated from the pixel defining layer 310 may be prevented. In example embodiments, the opening 380 of the reflective member 370 may expose the first light emitting layer 330, when viewed from a direction substantially perpendicular to an upper surface of the second substrate 350. In addition, a size of the opening 380 of the reflective member 370 may be greater than that of the first light emitting layer 330. For example, although the diffused reflection of an external light is generated in a sloped surface of the pixel defining layer 310, the diffused reflection light may be extinguished or only a predetermined light may be transmitted when the diffused reflection light is pass through the first and second light transmitting members 400 and 405. That is, the reflective member 370 may not overlap the first and second light emitting layers 330 and 335 to cover (e.g., hide) the sloped surface of the pixel defining layer 310 which generates the diffused reflection. Accordingly, a size of the opening 380 of the reflective member 370 may be increased, and an opening ratio of the OLED device 100 may be increased (e.g., a size of the sub-pixel region II is relatively increased).

The second substrate 350 may be disposed on the reflective member 370 and the first and second light transmitting members 400 and 405. The second substrate 350 and the first substrate 110 may include substantially the same materials. For example, the second substrate 350 may include quartz, synthetic quartz, calcium fluoride, fluoride-doping quartz, sodalime glass, non-alkali glass etc. In some example embodiments, the second substrate 350 may include a transparent inorganic material or flexible plastic. For example, the second substrate 350 may include a flexible transparent resin substrate. In this case, to increase flexibility of the OLED device 100, the second substrate 350 may include a stacked structure where at least one organic layer and at least one inorganic layer are alternately stacked.

The OLED device 100 in accordance with example embodiments includes the reflective member 370 having the opening 380 and the first and second light transmitting members 400 and 405 that partially overlap the reflective member 370. Accordingly, the OLED device 100 may protect the first and second light emitting layers 330 and 335 from UV rays without a polarizer, and an opening ratio of the OLED device 100 may be increased. In addition, the OLED device 100 may serve as a mirror display device that visibility of the OLED device 100 is improved.

FIGS. 3, 4, 5, 6, 7, 8 and 9 are cross-sectional views illustrating a method of manufacturing the OLED device in accordance with example embodiments.

Figure 3:
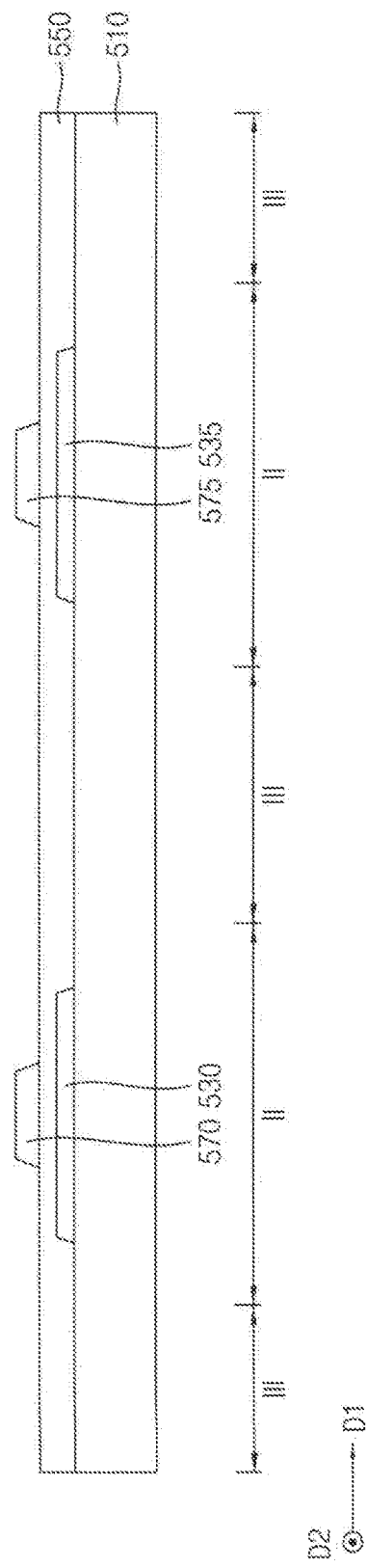
FIGS. 3, 4, 5, 6, 7, 8 and 9 are cross-sectional views illustrating a method of manufacturing the OLED device in accordance with example embodiments.

Referring to FIG. 3, first and second active layers 530 and 535 may be formed in a sub-pixel region II on a first substrate 510. The first substrate 510 may be formed using quartz, synthetic quartz, calcium fluoride, fluoride-doping quartz, a sodalime glass, a non-alkali glass etc. Alternatively, a buffer layer (not shown) may be formed on the first substrate 510. The buffer layer may extend along a first direction from the sub-pixel region II into the reflective region III. The buffer layer may be entirely formed on the first substrate 510. The buffer layer may prevent the diffusion of metal atoms and/or impurities from the first substrate 510. The first and second active layers 530 and 535 may be formed in the sub-pixel region II on the first substrate 510. The first and second active layers 530 and 535 may be formed using an oxide semiconductor, an inorganic semiconductor, an organic semiconductor, etc. A gate insulating layer 550 may be formed on the first substrate 510. The gate insulating layer 550 may cover the first and second active layers 530 and 535, and may extend along the first direction on the first substrate 510. The gate insulating layer 550 may be entirely formed in the sub-pixel region II and the reflective region III on the first substrate 510. The gate insulating layer 550 may be formed using a silicon compound, a metal oxide, etc. First and second gate electrodes 570 and 575 may be formed on the gate insulating layer 550 under which the first and second active layers 530 and 535 are disposed, respectively. The first and second gate electrodes 570 and 575 may be formed using metal, alloy, metal nitride, conductive metal oxide, transparent conductive materials, etc.

Figure 4:
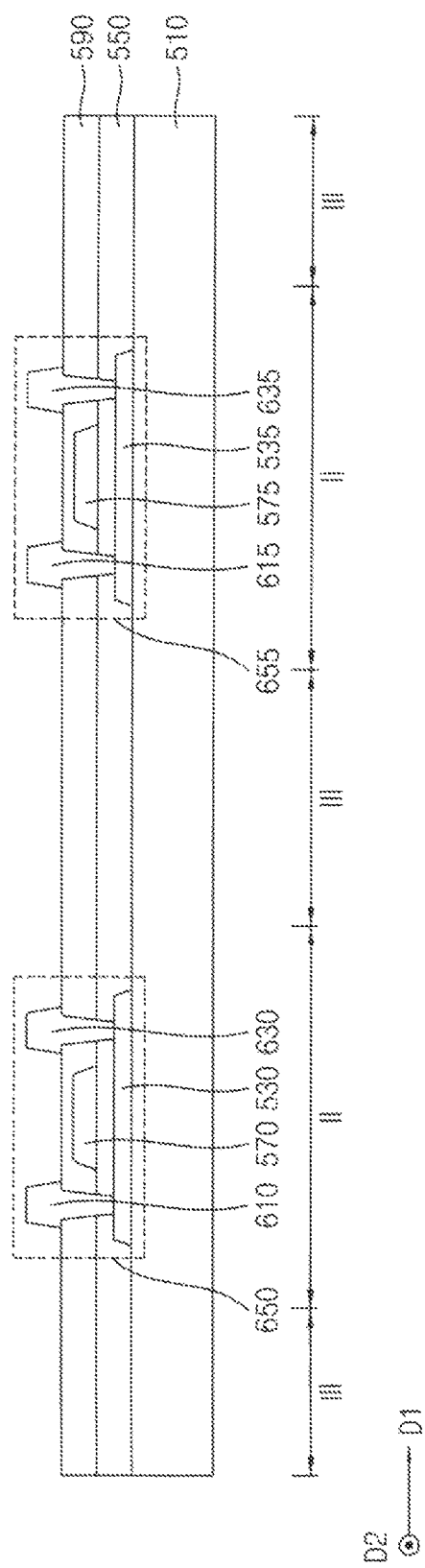

Referring to FIG. 4, an insulating interlayer 590 may be formed on the first and second gate electrodes 570 and 575. The insulating interlayer 590 may cover the first and second gate electrodes 570 and 575, and may extend along the first direction on the gate insulating layer 550. The insulating interlayer 590 may be entirely formed in the sub-pixel region II and the reflective region III on the first substrate 510. The insulating interlayer 590 may be formed using a silicon compound, a metal oxide, etc. First and second source electrodes 610 and 615 and the first and second drain electrodes 630 and 635 may be formed on the insulating interlayer 590. The first and second source electrodes 610 and 615 may contact a first side of the first and second active layers 530 and 535 via contact holes formed by removing a portion of the gate insulating layer 550 and the insulating interlayer 590. The first and second drain electrodes 630 and 635 may contact a second side of the first and second active layers 530 and 535 via contact hole formed by removing a portion of the gate insulating layer 550 and the insulating interlayer 590. Each of the first and second source electrodes 610 and 615 and the first and second drain electrodes 630 and 635 may include metal, alloy, metal nitride, conductive metal oxide, transparent conductive materials, etc. These may be used alone or in a combination thereof. In this way, first and second semiconductor elements 650 and 655 having the first and second active layers 530 and 535, the first and second gate electrodes 570 and 575, the first and second source electrodes 610 and 615, and the first and second drain electrodes 630 and 635 may be formed.

Figure 5:
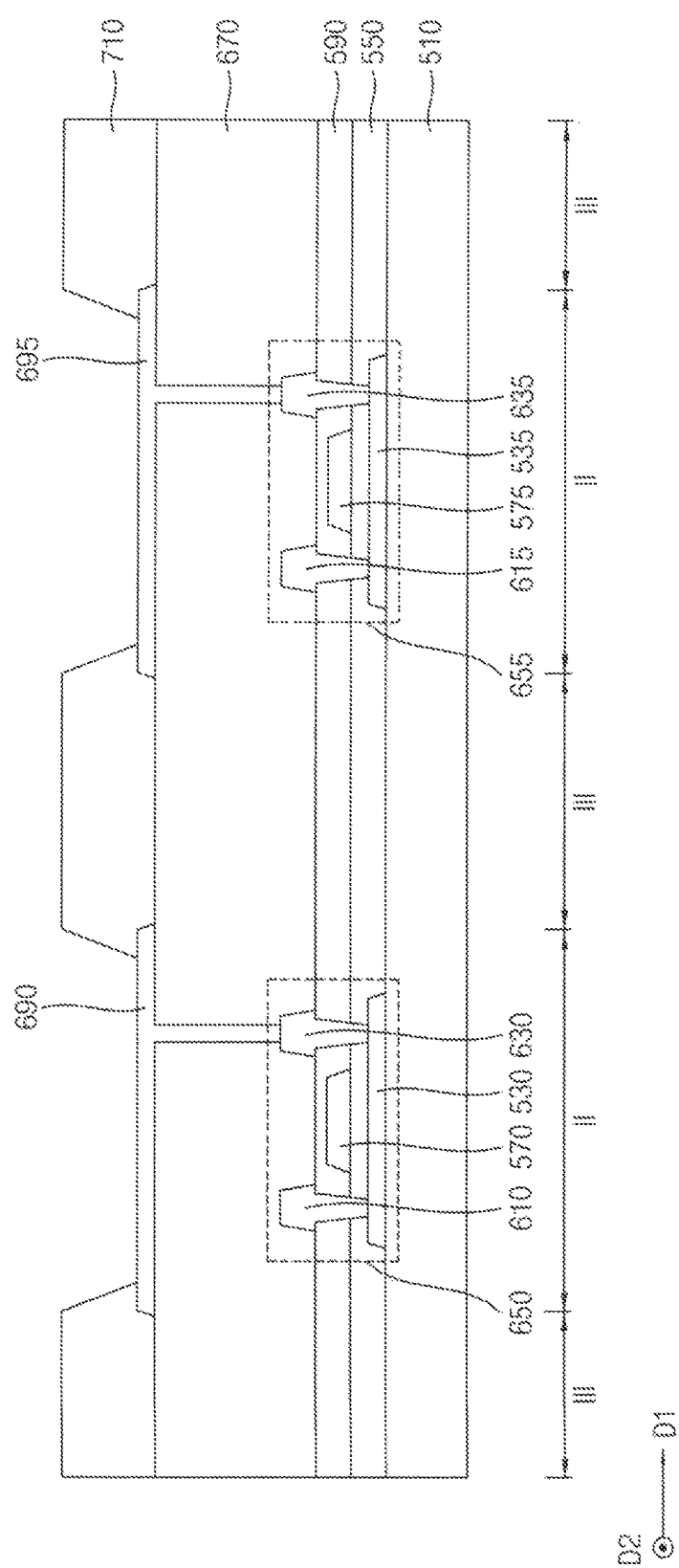

Referring to FIG. 5, a planarization layer 670 may be formed on the insulating interlayer 590. The planarization layer 670 may cover the first and second source electrodes 610 and 615 and the first and second drain electrodes 630 and 635, and may extend along the first direction on the insulating interlayer 590. The planarization layer 670 may be entirely formed in the sub-pixel region II and the reflective region III on the first substrate 510. The planarization layer 670 may be formed using a silicon compound, a metal oxide, etc. First and second lower electrodes 690 and 695 may be formed on the planarization layer 670. Each of the first and second lower electrodes 690 and 695 may contact each of the first and second source electrodes 610 and 615 via a contact hole formed by removing a portion of the planarization layer 670. The first and second lower electrodes 690 and 695 may be formed using metal, alloy, metal nitride, conductive metal oxide, transparent conductive materials, etc. A pixel defining layer 710 may be formed on a portion of the planarization layer 670 and a portion of the first and second lower electrodes 690 and 695. The pixel defining layer 710 may be formed on the planarization layer 670 to expose a portion of each of the first and second lower electrodes 690 and 695. The pixel defining layer 710 may be formed using organic materials or inorganic materials.

Figure 6:
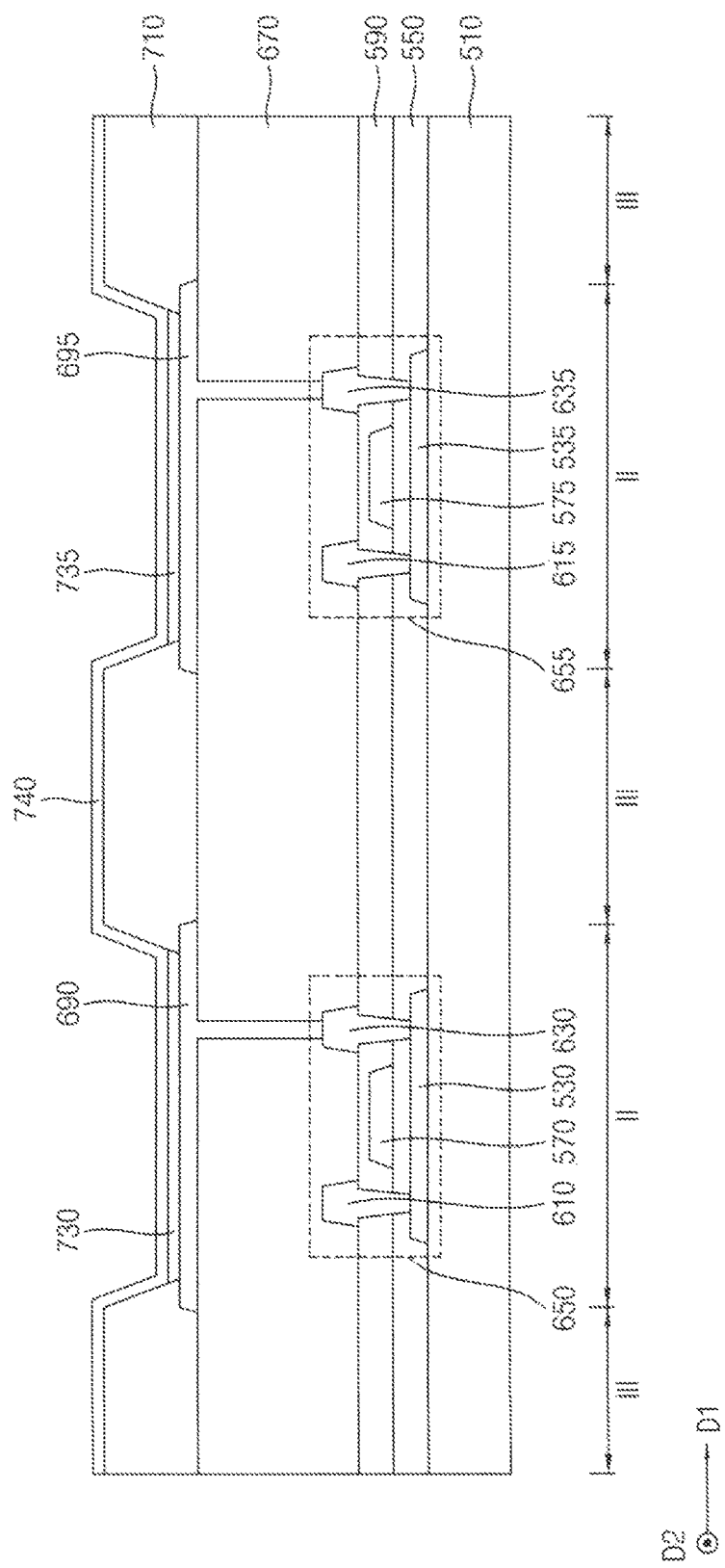

Referring to FIG. 6, first and second light emitting layers 730 and 735 may be formed on the exposed portion of the first and second lower electrodes 690 and 695, respectively. The first and second light emitting layers 730 and 735 may be formed using light emitting materials capable of generating different colors of light (e.g., a red color of light, a blue color of light, and a green color of light) according to the first through third sub pixels illustrated in FIG. 1. An upper electrode 740 may be formed on the pixel defining layer 710 and the first and second light emitting layers 730 and 735. The upper electrode 740 may cover the pixel defining layer 710 and the first and second light emitting layers 730 and 735 in the sub-pixel region II and the reflective region III, and may extend along the first direction on the pixel defining layer 710 and the first and second light emitting layers 730 and 735. That is, the upper electrode 740 may be commonly used by the first and second light emitting layers 730 and 735. The upper electrode 740 may be formed using metal, alloy, metal nitride, conductive metal oxide, a transparent conductive material, etc. These may be used alone or in a combination thereof.

Figure 7:
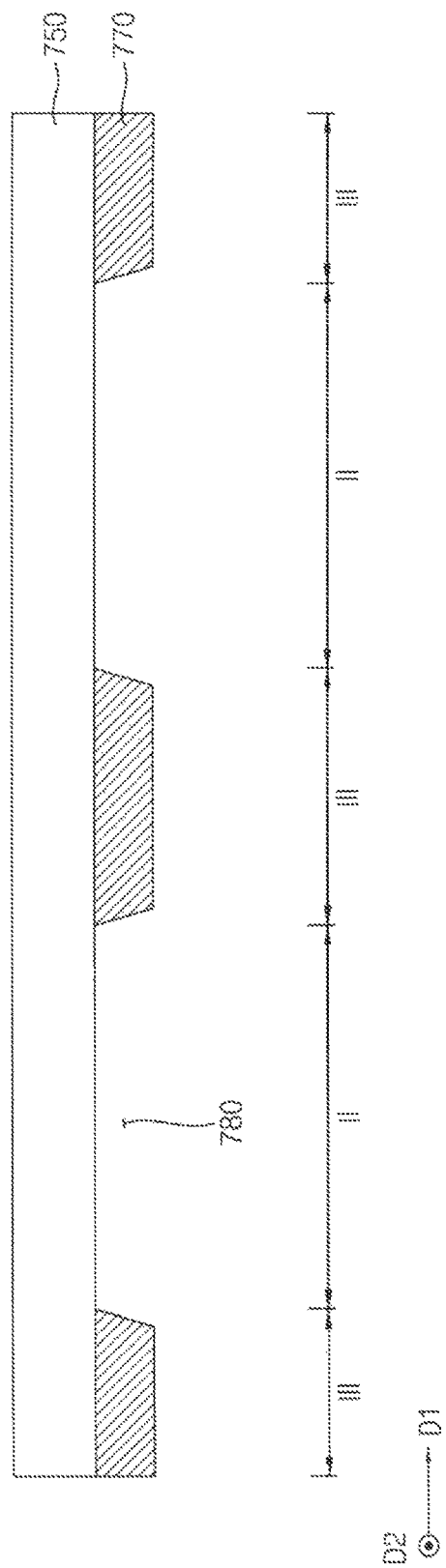

Referring to FIG. 7, a second substrate 750 may be provided. The second substrate 750 and the first substrate 510 may include substantially the same materials. For example, the second substrate 750 may be formed using quartz, synthetic quartz, calcium fluoride, fluoride-doping quartz, sodalime glass, non-alkali glass etc. In some example embodiments, the second substrate 750 may be formed using a transparent inorganic material or flexible plastic. For example, the second substrate 750 may include a flexible transparent resin substrate. In this case, to increase flexibility of an OLED device, the second substrate 750 may include a stacked structure where at least one organic layer and at least one inorganic layer are alternately stacked.

A reflective member 770 may be formed in a lower surface of the second substrate 750. The reflective member 770 may be disposed on the reflective region III. In addition, the reflective member 770 may substantially surround the sub-pixel region II, and may extend on the lower surface of the second substrate 750 in a second direction or a direction that is opposite to the second direction. Here, the second direction may be substantially perpendicular to the first direction. In addition, the reflective member 770 may include a plurality of openings. Each of the openings 780 may correspond to (e.g., overlap) the sub-pixel regions II. That is, the reflective member 770 may have a mesh structure defined by a plurality of openings 780.

The reflective member 770 may include a first surface and a second surface that is opposite to the first surface. The first surface may be in contact with the second substrate 750, and the second surface may face the upper electrode 740. The reflective member 770 may include a material that has relatively high reflective index. For example, the reflective member 770 may be formed by using Au, Ag, Al, Pt, Ni, Ti, etc. Alternatively, the reflective member 770 may be formed by using a metal, a metal alloy, metal nitride, conductive metal oxide, transparent conductive materials, etc. For example, the reflective member 770 may be formed of an alloy of aluminum, AlNx, an alloy of silver, WNx, an alloy of copper, CrNx, an alloy of molybdenum, TiNx, TaNx, SRO, ZnOx, SnOx, InOx, GaOx, ITO, IZO, etc.

Figure 8:
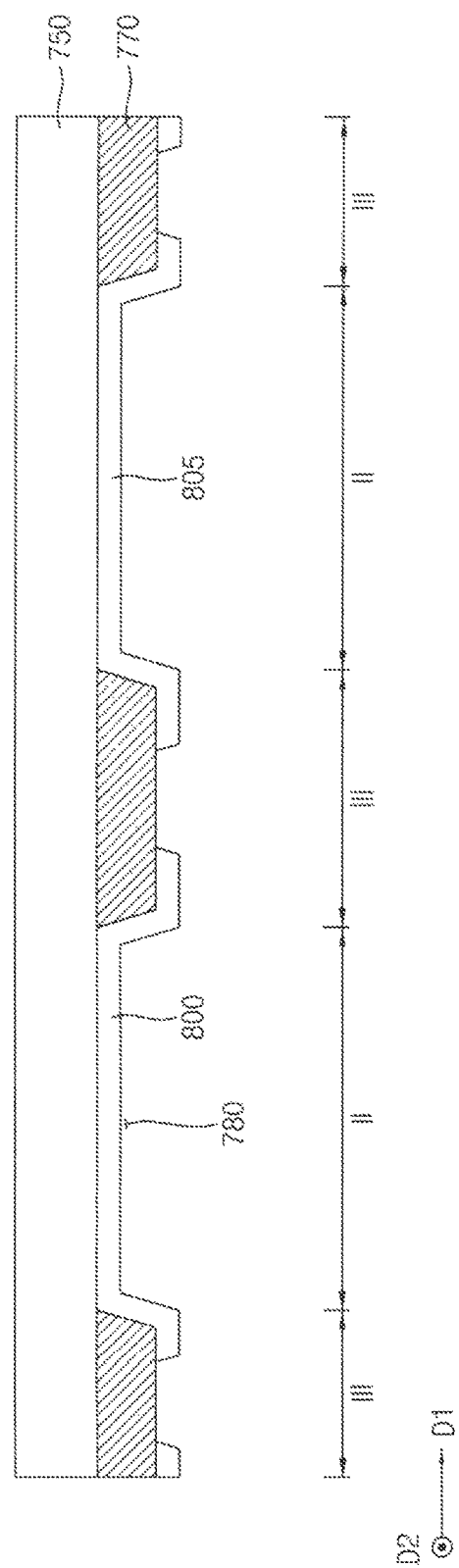
Figure 9:
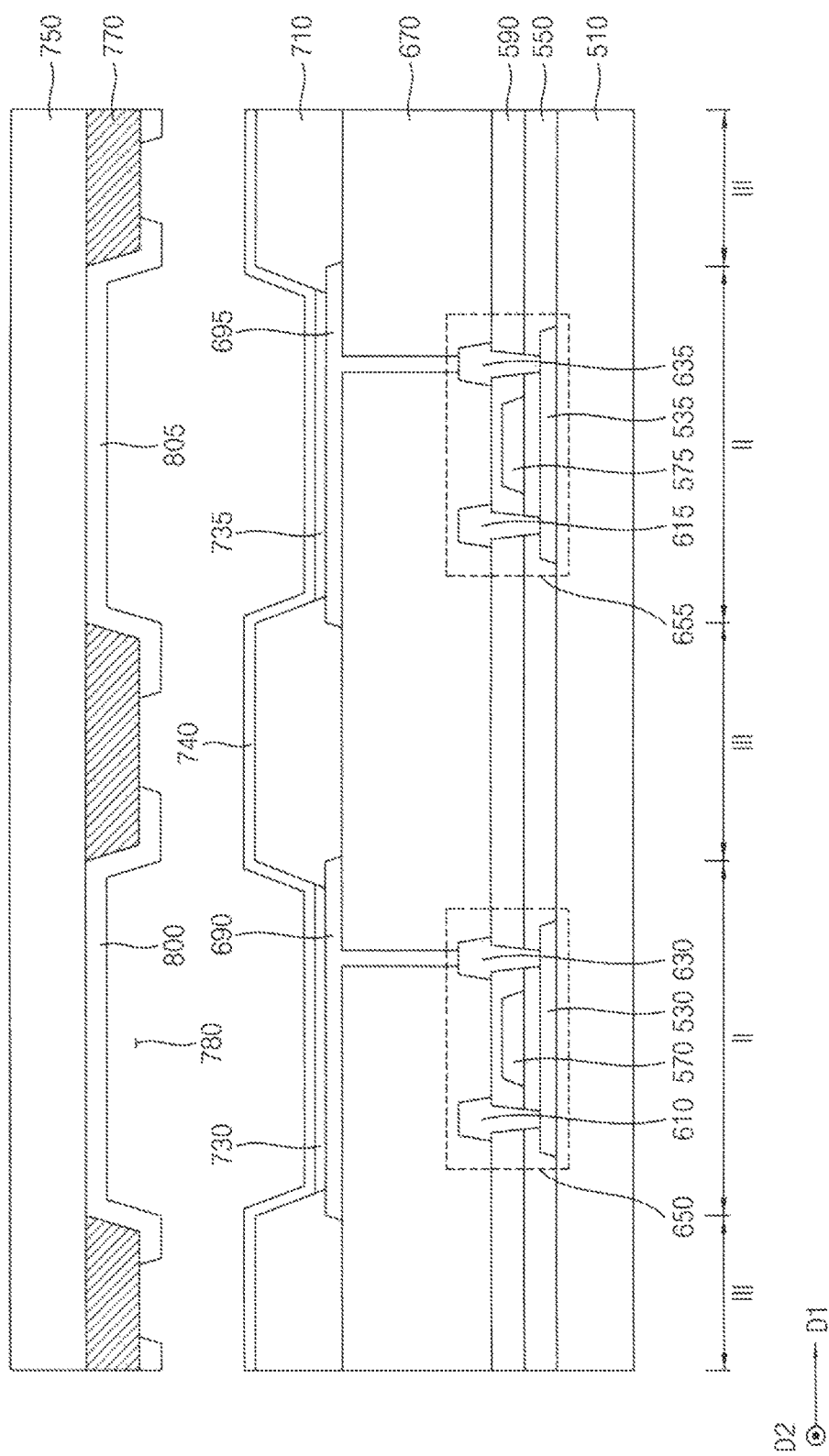

Referring to FIGS. 8 and 9, each of first and second light transmitting members 800 and 805 may cover the opening 380 of the reflective member 770, and then may partially overlap the reflective member 770. That is, the first and second light transmitting members 800 and 805 may overlap the sub-pixel region II and the at least a portion of the reflective region III. For example, opposite side portions of each of the first and second light transmitting members 800 and 805 may be disposed on the second surface of the reflective member 770 to surround each of the reflective members 770 such that each of the first and second light transmitting members 800 and 805 overlaps at least a portion of the reflective member 770. Each of the first and second light transmitting members 800 and 805 may transmit a predetermined light, and may block UV rays. In example embodiments, each of the first and second light transmitting members 800 and 805 may be formed by using a color filter. Each of the first and second light transmitting members 800 and 805 may be formed by using at least one among a red color filter, a green color filter, a blue color filter according to colors of light emitted by the first and second light emitting layers 730 and 735 of the OLED device. A color of each color filter of the first and second light transmitting members 800 and 805 formed on the first and second light emitting layers 730 and 735 may be the same as that of a light generated from each of the first and second light emitting layers 730 and 735. The color filter may be formed by using a photosensitive resin. In addition, the color filter used as the light transmitting member may include a material capable of blocking UV rays. For example, the material blocking UV rays may be formed by using benzotriazole based compound, benzophenone based compound, cyano acrylate based compound, salicylic acid based compound, etc.

The second substrate 750 having the reflective member 770 and the first and second light transmitting members 800 and 805 may be combined with the first substrate 510 on the upper electrode 740 by performing an encapsulation process. Accordingly, the OLED device illustrated in FIG. 9 may be manufactured.

Figure 10:
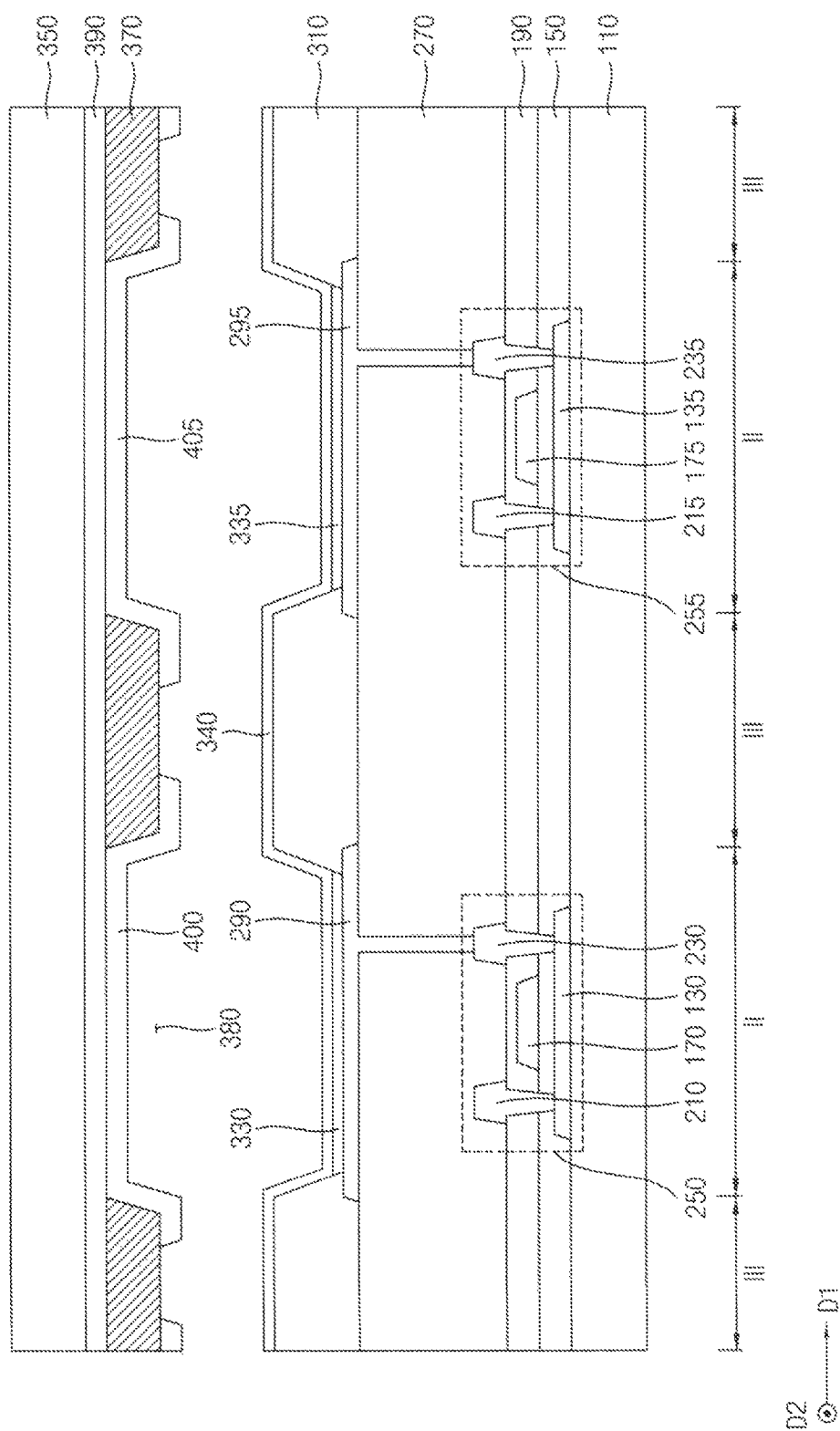
FIG. 10 is a cross-sectional view illustrating the OLED device in accordance with example embodiments.

FIG. 10 is a cross-sectional view illustrating the OLED device in accordance with example embodiments. An OLED device illustrated in FIG. 10 may have a configuration substantially the same as or similar to that of an OLED device 100 described with reference to FIG. 2 except a transflective layer 390. In FIG. 10, detailed descriptions for elements, which are substantially the same as or similar to the elements described with reference to FIG. 2, will be omitted.

Referring to FIG. 10, an OLED device may include a first substrate 110, first and second semiconductor elements 250 and 255, a gate insulating layer 150, an insulating interlayer 190, a planarization layer 270, first and second pixel structures, a pixel defining layer 310, a second substrate 350, a reflective member 370, first and second light transmitting members 400 and 405, a transflective layer 390, etc. Here, each of the first and second pixel structures may include first and second lower electrodes 290 and 295, first and second light emitting layer 330 and 335, an upper electrode 340. Each of the first and second semiconductor elements 250 and 255 may include first and second active layers 130 and 135, first and second gate electrodes 170 and 175, first and second source electrodes 210 and 215, and first and second drain electrodes 230 and 235.

The OLED device may include a plurality of pixel regions. One pixel region among a plurality of the pixel regions may have a sub-pixel region II and a reflective region III. The first and second semiconductor elements 250 and 255, the first and second lower electrodes 290 and 295, the first and second light emitting layers 330 and 335, etc may be disposed in the sub-pixel region II. The pixel defining layer 310, the reflective member 370, etc may be disposed in the reflective region III. In example embodiments, each of the first and second light transmitting members 400 and 405 may be disposed in the sub-pixel region II and at least a portion of the reflective region III. In addition, each of the first and second light transmitting members 400 and 405 may transmit a predetermined light, and may block ultraviolet (UV) rays. Further, each of the first and second light transmitting members 400 and 405 may have a predetermined color. In example embodiments, the transflective layer 390 may be disposed in a lower surface of the entire second substrate 350.

For example, a display image may be displayed in the sub-pixel region II, and an image of an object that is disposed in the front of the OLED device may be reflected in the reflective region III. As the OLED device includes the reflective member 370, the first and second light transmitting members 400 and 405, and the transflective layer 390, the OLED device may serve as a mirror display device.

The transflective layer 390 may be interposed between the second substrate 350 and the reflective and light transmitting members 370, 400, and 405. The transflective layer 390 may extend on the lower surface of the second substrate 350 in a first direction from the sub-pixel region II into the reflective region III. That is, the transflective layer 390 may be disposed on the entire second substrate 350.

The transflective layer 390 may transmit a portion of light and may reflect a remaining portion of the light. For example, a thickness of the transflective layer 390 may be less than that of the reflective member 370, and a light transmissivity of the transflective layer 390 may be greater than that of the reflective member 370. In addition, the transflective layer 390 may be disposed between the second substrate 350 and the reflective and light transmitting members 370, 400, and 405 to prevent a diffraction phenomenon of light generated from the reflective member 370 having a plurality of openings 380. Accordingly, the OLED device may serve as a mirror display device that visibility of the OLED device is improved. For example, the transflective layer 390 may be formed of Au, Ag, Al, Pt, Ni, Ti, etc. Alternatively, the transflective layer 390 may be formed of a metal, a metal alloy, metal nitride, conductive metal oxide, transparent conductive materials, etc. For example, the transflective layer 390 may be formed of an alloy of aluminum, AlNx, an alloy of silver, WNx, an alloy of copper, CrNx, an alloy of molybdenum, TiNx, TaNx, SRO, ZnOx, SnOx, InOx, GaOx, ITO, IZO, etc.

In example embodiments, the transflective layer 390 of the OLED device may have a single layer, but not being limited thereto. In some example embodiments, the transflective layer may have a multi layer structure having a plurality of layers.

In addition, the transflective layer 390 may be disposed between the second substrate 350 and light transmitting members 370, 400, and 405, but not being limited thereto. For example, the transflective layer may be disposed between the reflective member 370 and the first and second light transmitting members 400 and 405 or may be disposed under the reflective member 370 and the first and second light transmitting members 400 and 405.

Figure 11:
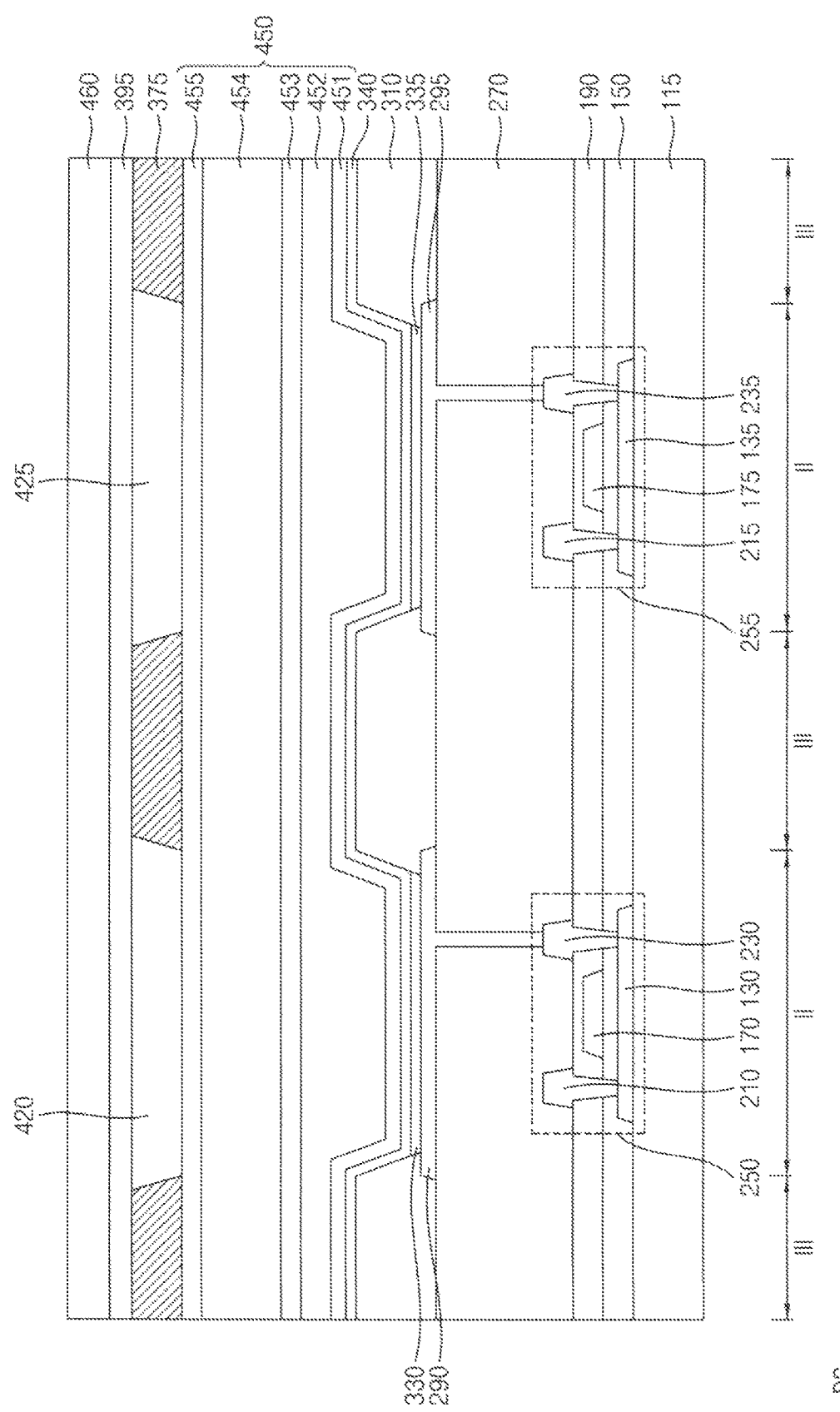
FIG. 11 is a cross-sectional view illustrating the OLED device in accordance with example embodiments.

FIG. 11 is a cross-sectional view illustrating the OLED device in accordance with example embodiments. An OLED device illustrated in FIG. 11 may have a configuration substantially the same as or similar to that of an OLED device 100 described with reference to FIG. 2 except a flexible substrate 115, a reflective member 375, first and second light transmitting members 420 and 425, a transflective layer 395, a protection layer 460, and an encapsulation structure 450. In FIG. 11, detailed descriptions for elements, which are substantially the same as or similar to the elements described with reference to FIG. 2, will be omitted.

Referring to FIG. 11, an OLED device may include a flexible substrate 115, first and second semiconductor elements 250 and 255, a gate insulating layer 150, an insulating interlayer 190, a planarization layer 270, first and second pixel structures, a pixel defining layer 310, an encapsulation structure 450 (e.g., thin film encapsulation structure), a reflective member 375, first and second light transmitting members 420 and 425, a transflective layer 395, a protection layer 460, etc. Here, each of the first and second pixel structures may include first and second lower electrodes 290 and 295, first and second light emitting layer 330 and 335, an upper electrode 340. Each of the first and second semiconductor elements 250 and 255 may include first and second active layers 130 and 135, first and second gate electrodes 170 and 175, first and second source electrodes 210 and 215, and first and second drain electrodes 230 and 235. In addition, the encapsulation structure 450 may include first through fifth encapsulation layers 451, 452, 453, 454, and 455.

The OLED device may include a plurality of pixel regions. One pixel region among a plurality of the pixel regions may have a sub-pixel region II and a reflective region III. In example embodiments, the reflective member 375, the first and second light transmitting members 420 and 425, transflective layer 395, and the protection layer 460 may be disposed on the encapsulation structure 450. In addition, each of first and second light transmitting members 420 and 425 may transmit a predetermined light, and may block UV rays. Further, each of the first and second light transmitting members 420 and 425 may have a predetermined color. In example embodiments, the transflective layer 395 may be disposed on the entire reflective member 375 and the entire first and second light transmitting members 420 and 425.

For example, a display image may be displayed in the sub-pixel region II, and an image of an object that is disposed in the front of the OLED device may be reflected in the reflective region III. As the OLED device includes the reflective member 375, the first and second light transmitting members 420 and 425, the transflective layer 395, the protection layer 460, and the encapsulation structure 450, the OLED device may serve as a flexible mirror display device.

In example embodiments, the flexible substrate 115 may be provided. The flexible substrate 115 may be formed of a flexible transparent material such as a flexible transparent resin substrate (e.g., a polyimide substrate).

The first and second semiconductor elements 250 and 255 and the first and second pixel structures and the pixel defining layer 310 may be disposed on the flexible substrate 115.

The encapsulation structure 450 may be disposed on the upper electrode 340. The encapsulation structure 450 may include at least one inorganic layer and at least one organic layer. For example, the inorganic layer and the organic layer may be alternately and repeatedly arranged. In example embodiments, the first encapsulation layer 451 may be formed on the upper electrode 340. The first encapsulation layer 451 may cover the upper electrode 340, and may be disposed as a substantially uniform thickness along a profile of the upper electrode 340. The first encapsulation layer 451 may prevent the first and second pixel structures from being deteriorated by the permeation of moisture, water, oxygen, etc. In addition, the first encapsulation layer 451 may protect the first and second pixel structures from external impacts. The first encapsulation layer 451 may be formed by using inorganic materials.

The second encapsulation layer 453 may be disposed on the first encapsulation layer 451. The second encapsulation layer 452 may improve the flatness of the OLED device, and may protect the first and second pixel structures disposed in the sub-pixel region II. The second encapsulation layer 452 may include organic materials.

The third encapsulation layer 453 may be disposed on the second encapsulation layer 452. The third encapsulation layer 453 may cover the second encapsulation layer 452, and may be disposed as a substantially uniform thickness along a profile of the second encapsulation layer 452. The third encapsulation layer 453 together with the first encapsulation layer 451 and the second encapsulation layer 452 may prevent the first and second pixel structures from being deteriorated by the permeation of moisture, water, oxygen, etc. In addition, the third encapsulation layer 453 together with the first encapsulation layer 451 and the second encapsulation layer 452 may protect the first and second pixel structures from external impacts. The third encapsulation layer 453 may include inorganic materials.

The fourth encapsulation layer 454 may be disposed on the third encapsulation layer 453. The fourth encapsulation layer 454 may perform functions substantially the same as or similar to those of the second encapsulation layer 452, and the fourth encapsulation layer 454 may include a material substantially the same as or similar to that of the second encapsulation layer 452. The fifth encapsulation layer 455 may be disposed on the fourth encapsulation layer 454. The fifth encapsulation layer 455 may perform functions substantially the same as or similar to those of the first and third encapsulation layers 451 and 453, and the fifth encapsulation layer 455 may include a material substantially the same as or similar to that of the first and third encapsulation layers 451 and 453. Alternatively, the encapsulation structure 450 may have three layers structure having the first encapsulation layer 451, the second encapsulation layer 452, and the third encapsulation layer 453 or seven layers structure having the first encapsulation layer 451, the second encapsulation layer 452, the third encapsulation layer 453, the fourth encapsulation layer 454, the fifth encapsulation layer 455, a sixth encapsulation layer, and a seventh encapsulation layer.

The reflective member 375 may be disposed in the reflective region III on the encapsulation structure 450, for example, the fifth encapsulation layer 455. The reflective member 375 may substantially surround the sub-pixel region II, and may extend on the fifth encapsulation layer 455 in a second direction or a direction that is opposite to the second direction. Here, the second direction may be substantially perpendicular to the first direction. In addition, the reflective member 375 may include a plurality of openings. Each of the openings may correspond to the sub-pixel regions II. That is, the reflective member 375 may have a mesh structure defined by a plurality of openings.

The reflective member 375 may include a first surface and a second surface that is opposite to the first surface. The first surface may be in contact with the encapsulation structure, for example, the fifth encapsulation layer 455, and the second surface may in contact with the transflective layer 395. A light incident through the protection layer 460 from an outside may be reflected from the second surface of the reflective member 375 (e.g., an image of an object that is disposed in the front of the OLED device is displayed on the second surface of the reflective member 375.). In addition, a light generated from the first and second light emitting layers 330 and 335 of the OLED device may pass through the openings disposed in the sub-pixel region II. The reflective member 375 may include a material that has relatively high reflective index. For example, the reflective member 375 may be formed of Au, Ag, Al, Pt, Ni, Ti, etc. Alternatively, the reflective member 375 may be formed of a metal, a metal alloy, metal nitride, conductive metal oxide, transparent conductive materials, etc. For example, the reflective member 375 may be formed of an alloy of aluminum, AlNx, an alloy of silver, WNx, an alloy of copper, CrNx, an alloy of molybdenum, TiNx, TaNx, SRO, ZnOx, SnOx, InOx, GaOx, ITO, IZO, etc.

Each of the first and second light transmitting members 420 and 425 may cover the opening of the reflective member 375. For example, each of the first and second light transmitting members 420 and 425 may transmit a predetermined light, and may block UV rays. In example embodiments, each of the first and second light transmitting members 420 and 425 may include a color filter. Each of the first and second light transmitting members 420 and 425 may include at least one among a red color filter, a green color filter, a blue color filter according to colors of light emitted from the first and second light emitting layers 330 and 335 of the OLED device. A color of each color filter of the first and second light transmitting members 420 and 425 disposed on the first and second light emitting layers 330 and 335 may be the same as that of a light generated from each of the first and second light emitting layers 330 and 335. Alternatively, each of the first and second light transmitting members 420 and 425 may include a yellow color filter, a cyan color filter, and a magenta color filter. The color filter may be formed of a photosensitive resin. In addition, the color filter used as the light transmitting member may include a material capable of blocking UV rays. For example, the material blocking UV rays may include benzotriazole based compound, benzophenone based compound, cyano acrylate based compound, salicylic acid based compound, etc.

Since the first and second light transmitting members 420 and 425 block UV rays, the first and second light emitting layers 330 and 335 may be protected from UV rays. In addition, as the first and second light transmitting members 420 and 425 are disposed in the opening of the reflective member 375, a diffused reflection generated from the pixel defining layer 310 may be prevented. Accordingly, an opening ratio of the OLED device may be increased.

The transflective layer 395 may be disposed on the reflective member 375 and the first and second light transmitting members 420 and 425. That is, the transflective layer 395 may extend on the reflective member 375 and the first and second light transmitting members 420 and 425 in a first direction from the sub-pixel region II into the reflective region III. That is, the transflective layer 395 may be disposed on the entire reflective member 375 and the entire first and second light transmitting members 420 and 425.

The transflective layer 395 may transmit a portion of a light and may reflect a remaining portion of the light. For example, a thickness of the transflective layer 395 may be less than that of the reflective member 375, and a light transmissivity of the transflective layer 395 may be greater than that of the reflective member 375. In addition, the transflective layer 395 may be disposed on the reflective member 375 and the first and second light transmitting members 420 and 425 to prevent a diffraction phenomenon of light generated from the reflective member 375 having a plurality of openings. Accordingly, the OLED device may serve as a mirror display device that visibility of the OLED device is improved. For example, the transflective layer 395 may be formed of Au, Ag, Al, Pt, Ni, Ti, etc. Alternatively, the transflective layer 395 may be formed of a metal, a metal alloy, metal nitride, conductive metal oxide, transparent conductive materials, etc. For example, the transflective layer 395 may be formed of an alloy of aluminum, AlNx, an alloy of silver, WNx, an alloy of copper, CrNx, an alloy of molybdenum, TiNx, TaNx, SRO, ZnOx, SnOx, InOx, GaOx, ITO, IZO, etc.

The protection layer 460 may be disposed on the transflective layer 395. The protection layer 460 may protect the transflective layer 395, the reflective member 375, and the first and second light transmitting members 420 and 425. For example, the protection layer 460 may be formed of polyethylene terephthalate (PET), polyethylene naphthalate (PEN), polypropylene (PP), polycarbonate (PC), polystyrene (PS), polysulfone (PSul), polyethyene (PE), polyphthalamide (PPA), polyethersulfone (PES), polyarylate (PAR), polycarbonate oxide (PCO), modified polyphenylene oxide (MPPO).

In example embodiments, the OLED device may include the transflective layer 395, but not being limited thereto. In some example embodiments, the OLED device may not include the transflective layer.

In addition, the transflective layer 395 may be disposed between the second substrate 350 and the reflective and first and second light transmitting members 375, 420 and 425, but not being limited thereto. For example, the reflective member may be disposed between the reflective member 375 and the fifth encapsulation layer 455.

Figure 12:
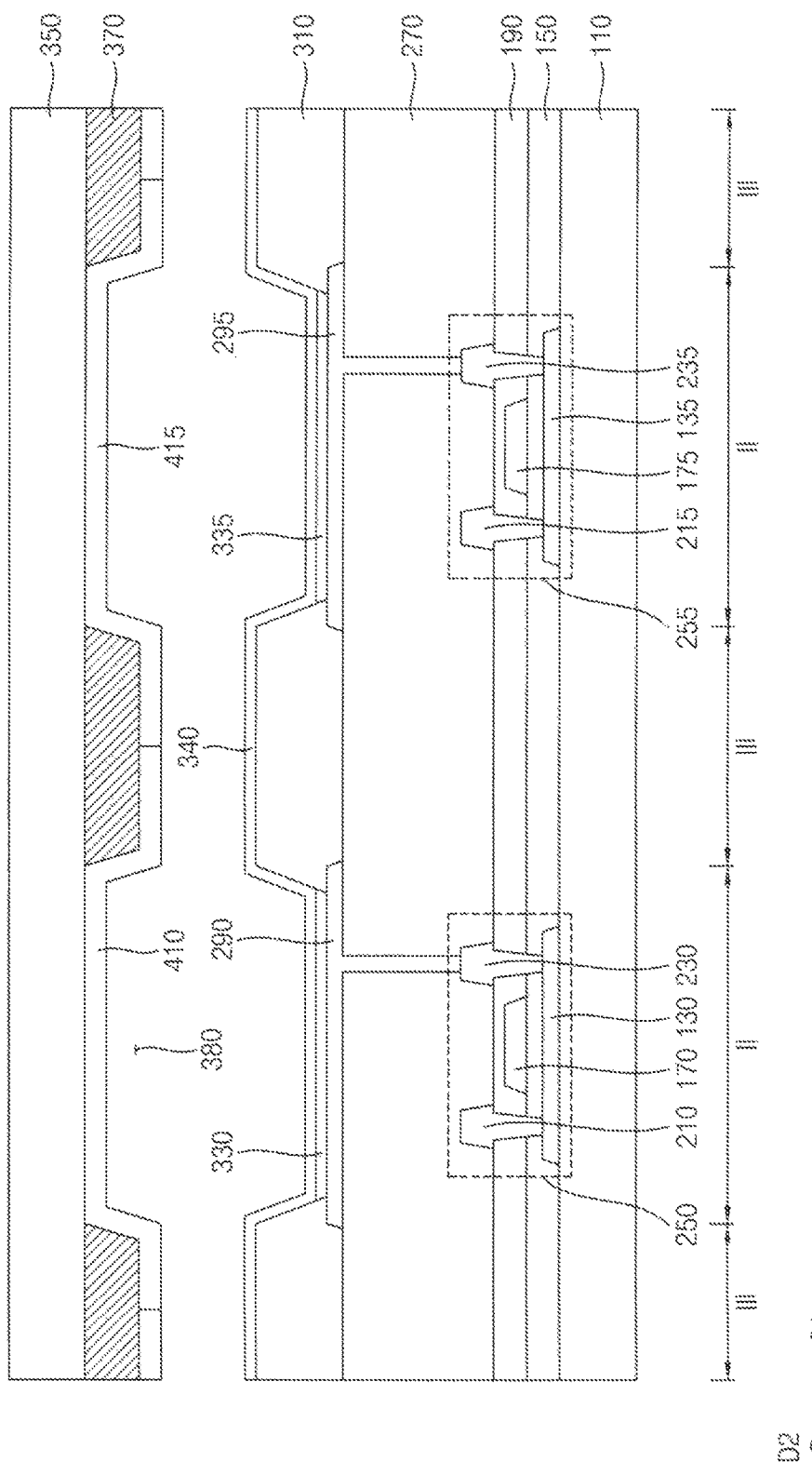
FIG. 12 is a cross-sectional view illustrating the OLED device in accordance with example embodiments.

FIG. 12 is a cross-sectional view illustrating the OLED device in accordance with example embodiments. An OLED device illustrated in FIG. 12 may have a configuration substantially the same as or similar to that of an OLED device 100 described with reference to FIG. 2 except first and second light transmitting members 410 and 415. In FIG. 12, detailed descriptions for elements, which are substantially the same as or similar to the elements described with reference to FIG. 2, will be omitted.

Referring to FIG. 12, an OLED device may include a first substrate 110, first and second semiconductor elements 250 and 255, a gate insulating layer 150, an insulating interlayer 190, a planarization layer 270, first and second pixel structures, a pixel defining layer 310, a second substrate 350, a reflective member 370, first and second light transmitting members 410 and 415, etc. Here, each of the first and second pixel structures may include first and second lower electrodes 290 and 295, first and second light emitting layer 330 and 335, an upper electrode 340. Each of the first and second semiconductor elements 250 and 255 may include first and second active layers 130 and 135, first and second gate electrodes 170 and 175, first and second source electrodes 210 and 215, and first and second drain electrodes 230 and 235.

In example embodiments, each of the first and second light transmitting members 410 and 415 may be disposed in a sub-pixel region II and at least a portion of the reflective region III. For example, a display image may be displayed in the sub-pixel region II, and an image of an object that is disposed in the front of the OLED device may be reflected in the reflective region III. As the OLED device includes the reflective member 370 and the first and second light transmitting members 410 and 415, the OLED device may serve as a mirror display device.

The reflective member 370 may include a first surface and a second surface that is opposite to the first surface. The first surface may be in contact with the second substrate 350, and the second surface may face the upper electrode 340.

Each of the first and second light transmitting members 410 and 415 may overlap the opening 380 of the reflective member 370, and then adjacent two first and second light transmitting members 410 and 415 among the light transmitting members disposed in the sub-pixel region II may be contacted to each other on the second surface such that each of the first and second light transmitting members 410 and 415 covers the entire second surface of the reflective member 370. That is, the reflective member 370 may not be exposed by the first and second light transmitting members 410 and 415. In this case, a first light emitted from the first light emitting layer 330 may not be reflected from the reflective member 370, and the first light may not be mixed with a second light emitted from the second light emitting layer 335. Accordingly, as the OLED device includes the first and second light transmitting members 410 and 415, the OLED device may serve as a mirror display device that visibility of the OLED device is improved.

In example embodiments, the OLED device may not include a transflective layer, but not being limited thereto. In some example embodiments, the OLED device may include the transflective layer disposed between the first and second light transmitting members 410 and 415 and the reflective member 370.

Figure 13:
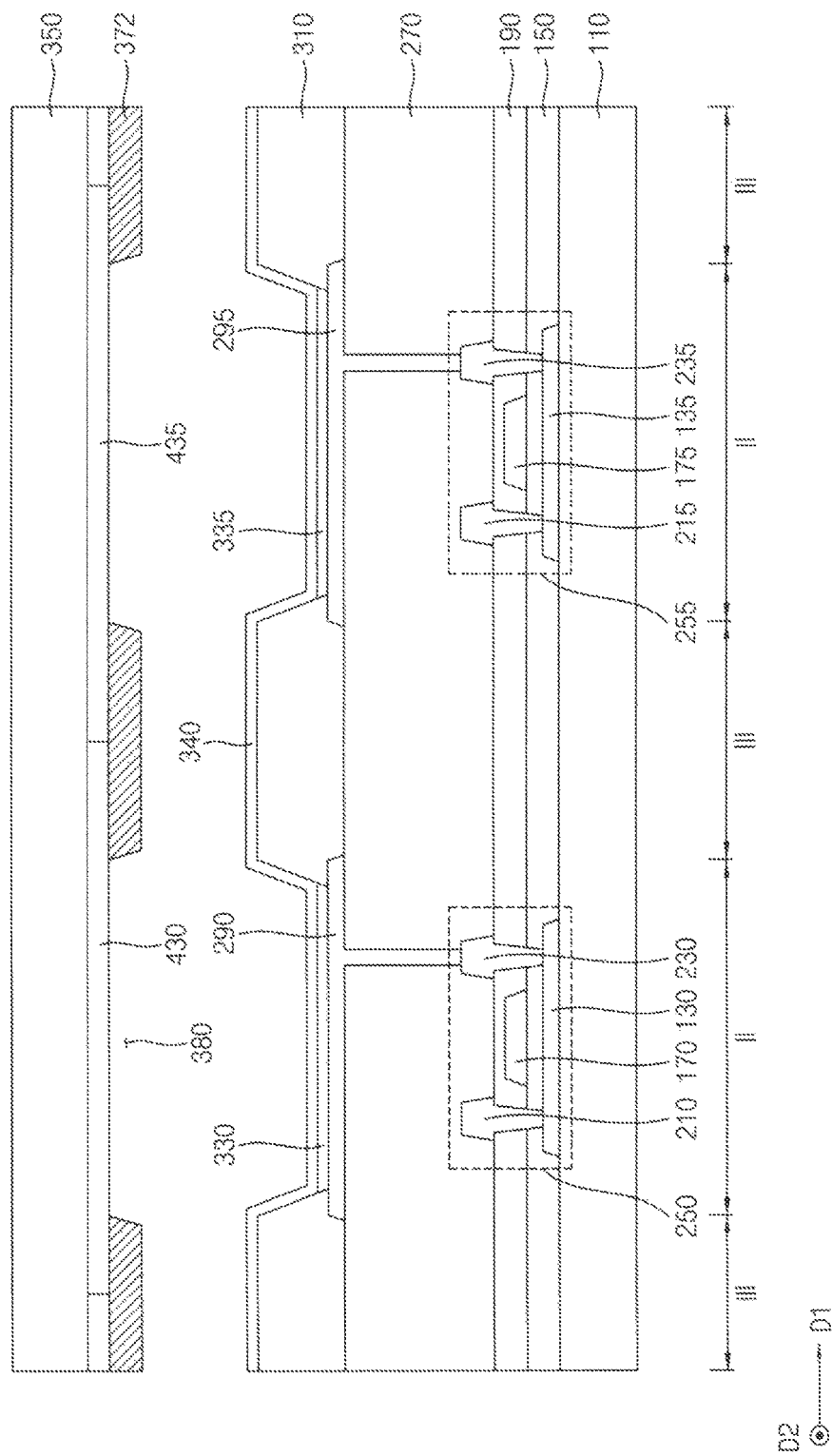
FIG. 13 is a cross-sectional view illustrating the OLED device in accordance with example embodiments.
Figure 14:
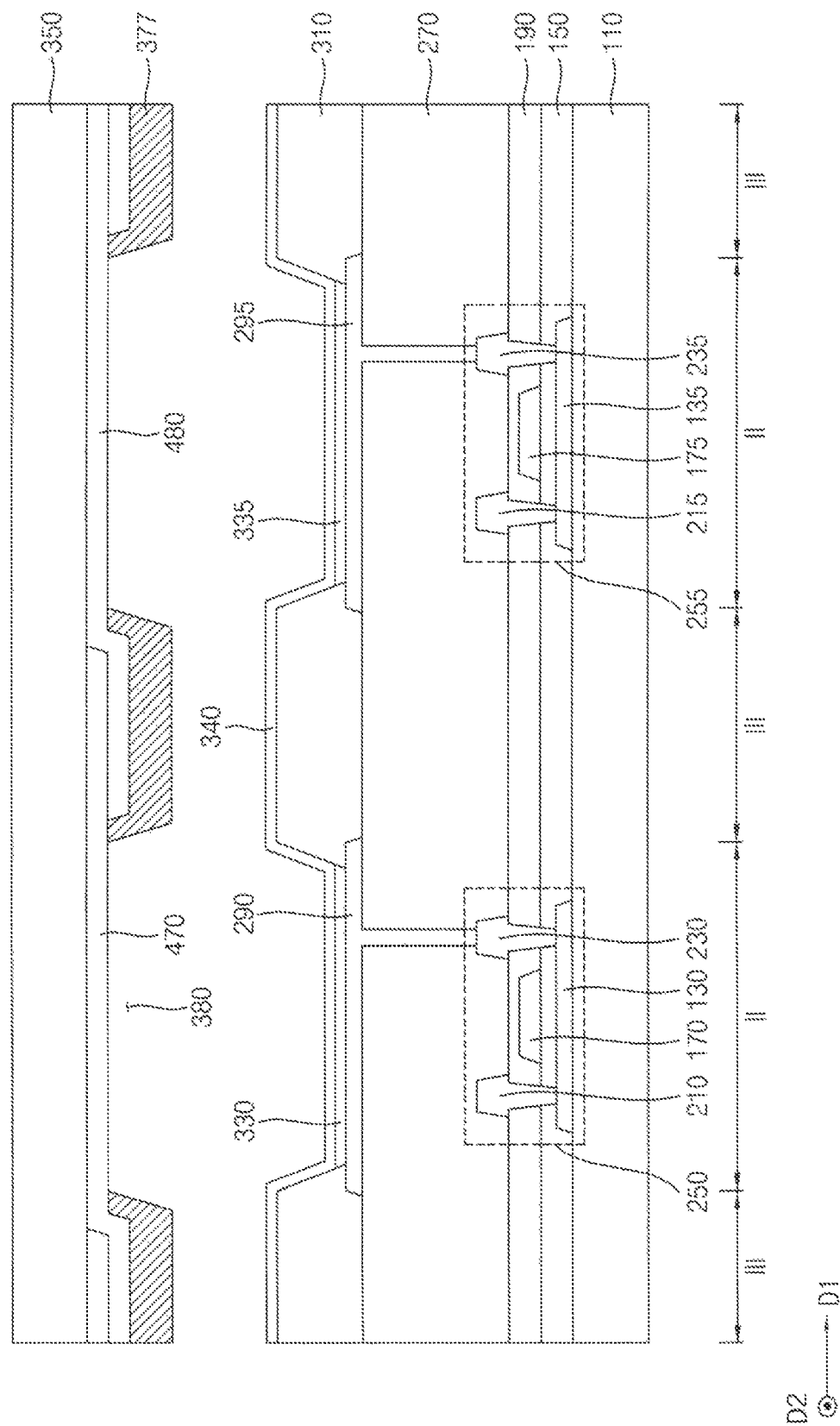
FIG. 14 is a cross-sectional view illustrating the OLED device in accordance with example embodiments.
Figure 15:
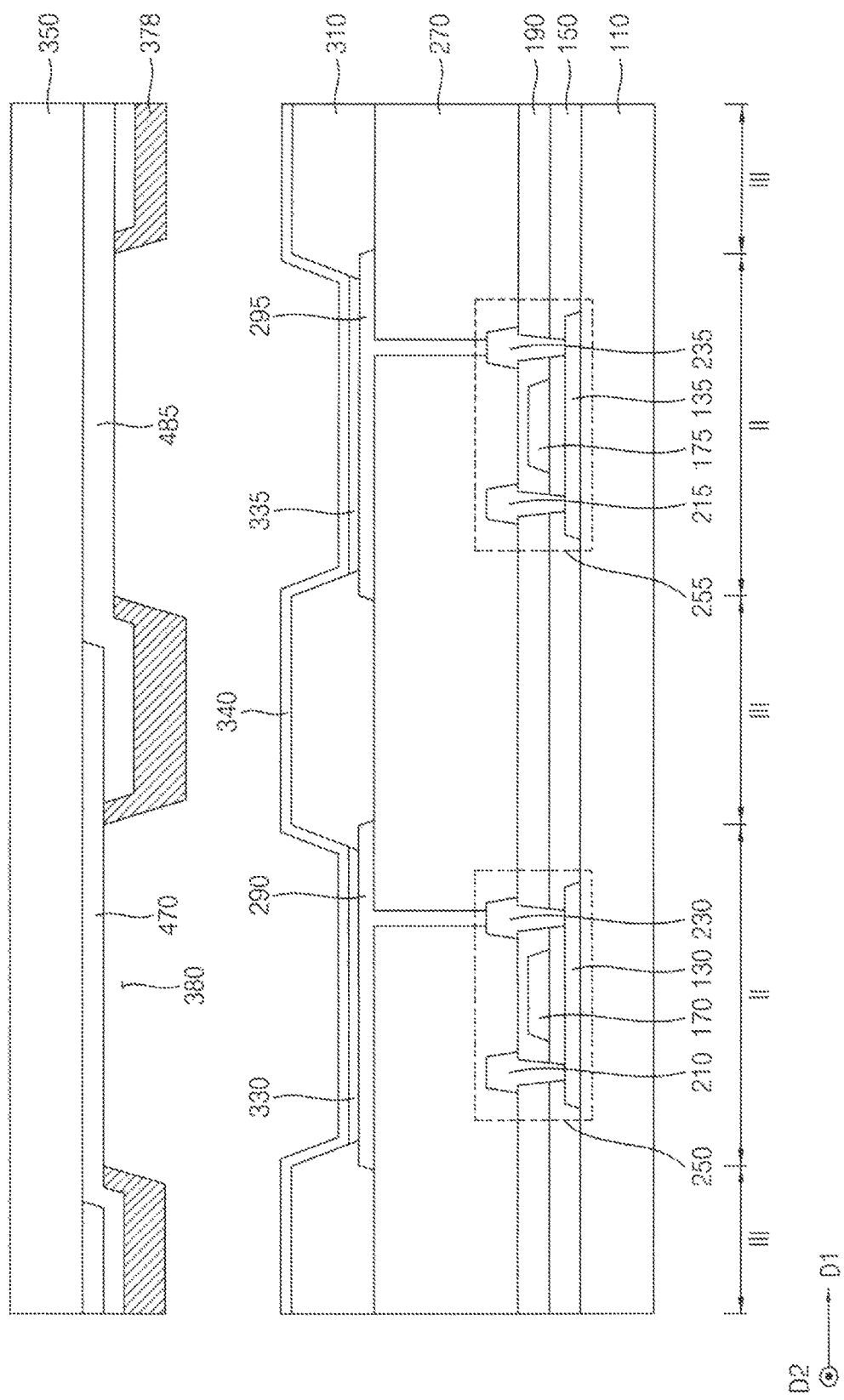
FIG. 15 is a cross-sectional view illustrating the OLED device in accordance with example embodiments.

FIGS. 13 through 15 are a cross-sectional view illustrating the OLED devices in accordance with example embodiments. OLED devices illustrated in FIGS. 13 through 15 may have a configuration substantially the same as or similar to that of an OLED device 100 described with reference to FIG. 2 except a shape of each of first and second light transmitting members and a shape of each of reflective members. In FIGS. 13 through 15, detailed descriptions for elements, which are substantially the same as or similar to the elements described with reference to FIG. 2, will be omitted.

Referring to FIG. 13, an OLED device may include a first substrate 110, first and second semiconductor elements 250 and 255, a gate insulating layer 150, an insulating interlayer 190, a planarization layer 270, first and second pixel structures, a pixel defining layer 310, a second substrate 350, a reflective member 372, first and second light transmitting members 430 and 435, etc. Here, each of the first and second pixel structures may include first and second lower electrodes 290 and 295, first and second light emitting layer 330 and 335, an upper electrode 340. Each of the first and second semiconductor elements 250 and 255 may include first and second active layers 130 and 135, first and second gate electrodes 170 and 175, first and second source electrodes 210 and 215, and first and second drain electrodes 230 and 235.

The reflective member 372 may include a first surface and a second surface that is opposite to the first surface. The first surface may face the second substrate 350, and the second surface may face the upper electrode 340.

Each of the first and second light transmitting members 430 and 435 may cover the opening 380 of the reflective member 372, and then may be disposed such that the first surface of the reflective member 372 is spaced apart from the second substrate 350. For example, adjacent two light transmitting members (e.g., first and second light transmitting members 430 and 435) among the light transmitting members disposed in the sub-pixel region II may be contacted to each other between the first surface of the reflective member 372 and the second substrate 350. That is, opposite side portions of each of the first and second light transmitting members 430 and 435 may be interposed between the reflective member 372 and the second substrate 350, and may be contacted to each other between the reflective member 372 and the second substrate 350. Alternatively, the opposite side portions of each of the first and second light transmitting members 430 and 435 may be spaced apart from each other between the reflective member 372 and the second substrate 350.

In this case, since the first and second light transmitting members 430 and 435 have a predetermined color, a color of the reflective member 372 may be substantially the same as that of the first and second light transmitting members 430 and 435. Accordingly, as the OLED device includes the first and second light transmitting members 430 and 435, the OLED device may serve as mirror display device having various colors.

Referring to FIG. 14, in some example embodiments, each of the first and second light transmitting members 470 and 480 may cover the opening 380 of the reflective member 377, and then may be disposed such that the first surface of the reflective member 377 is spaced apart from the second substrate 350. For example, adjacent two light transmitting members (e.g., first and second light transmitting members 470 and 480) among the light transmitting members disposed in the sub-pixel region II may be overlapped between the first surface of the reflective member 377 and the second substrate 350. That is, opposite side portions of each of the first and second light transmitting members 470 and 480 may be overlapped between the reflective member 377 and the second substrate 350, and may be contacted to each other between the reflective member 377 and the second substrate 350. Here, a thickness of the first light transmitting member 470 may be substantially the same as that of the second light transmitting member 480.

In this case, since the first and second light transmitting members 470 and 480 have a predetermined color, a color of the reflective member 377 may be substantially the same as an overlapped color of the first and second light transmitting members 470 and 480. Accordingly, as the OLED device includes the first and second light transmitting members 470 and 480, the OLED device may serve as mirror display device having various colors.

Referring to FIG. 15, in some example embodiments, each of the first and second light transmitting members 470 and 485 may cover the opening 380 of the reflective member 378, and then may be disposed such that the first surface of the reflective member 378 is spaced apart from the second substrate 350. For example, adjacent two light transmitting members (e.g., first and second light transmitting members 470 and 485) among the light transmitting members disposed in the sub-pixel region II may be overlapped between the first surface of the reflective member 378 and the second substrate 350. That is, opposite side portions of each of the first and second light transmitting members 470 and 485 may be overlapped between the reflective member 378 and the second substrate 350, and may be contacted to each other between the reflective member 378 and the second substrate 350. Here, a thickness of the first light transmitting member 470 may be different from a thickness of the second light transmitting member 480. That is, a thickness of the first light transmitting member 470 may be less than that of the second light transmitting member 485. In example embodiments, since the reflective member 378 has a predetermined thickness capable of reflecting an external light, a thickness of the reflective member 378 on a portion where the first and second light transmitting members 470 and 485 having the different thickness among a plurality of the pixel regions are disposed may have relatively high thickness.

In this case, since the first and second light transmitting members 470 and 485 have a predetermined color, a color of the reflective member 378 may be substantially the same as an overlapped color of the first and second light transmitting members 470 and 480. However, since the second light transmitting member 485 has relatively high thickness, a color of the reflective member 378 may be more close to a predetermined color of the second light transmitting member 485. Accordingly, as the OLED device includes the first and second light transmitting members 470 and 485, the OLED device may serve as mirror display device having various colors.

In example embodiments, the OLED device may not include a transflective layer, but not being limited thereto. In some example embodiments, the OLED device may include the transflective layer disposed on the first and second light transmitting members and the reflective member.

Figure 16:
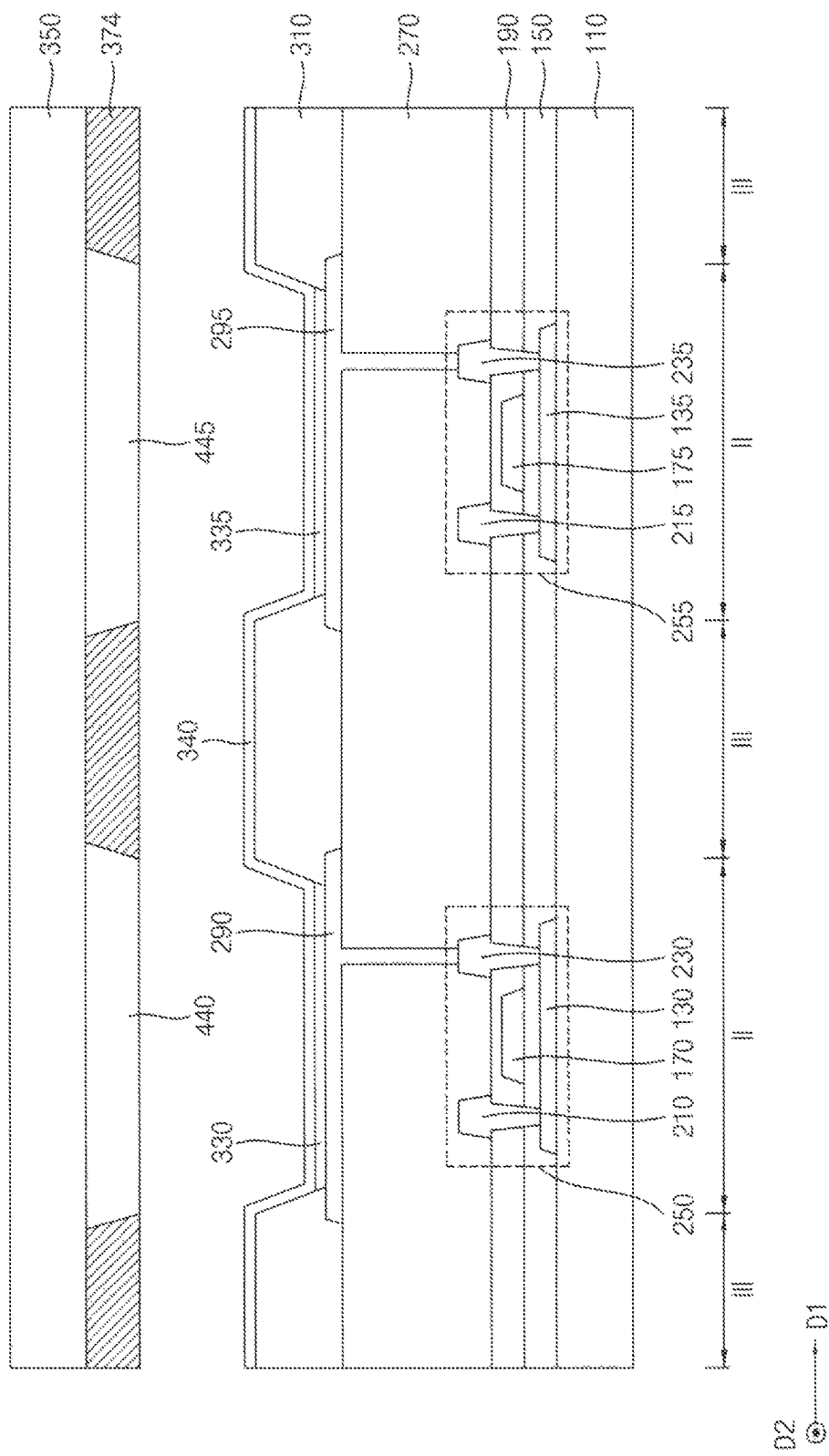
FIG. 16 is a cross-sectional view illustrating the OLED device in accordance with example embodiments.

FIG. 16 is a cross-sectional view illustrating the OLED device in accordance with example embodiments. An OLED device illustrated in FIG. 16 may have a configuration substantially the same as or similar to that of an OLED device 100 described with reference to FIG. 2 except first and second light transmitting members 440 and 445 and a reflective member 374. In FIG. 16, detailed descriptions for elements, which are substantially the same as or similar to the elements described with reference to FIG. 2, will be omitted.

Referring to FIG. 16, an OLED device may include a first substrate 110, a gate insulating layer 150, an insulating interlayer 190, a planarization layer 270, first and second pixel structures, a pixel defining layer 310, a second substrate 350, a reflective member 374, first and second light transmitting members 440 and 445, etc.

In example embodiments, the reflective member 374 may include a first surface and a second surface that is opposite to the first surface. The first surface may be in contact with the second substrate 350, and the second surface may face the upper electrode 340.

The first and second light transmitting members 440 and 445 may be disposed in lower surface of the second substrate 350. An opening may be disposed between the first and second light transmitting members 440 and 445. The reflective member 374 may be disposed in the opening. For example, after the first and second light transmitting members 440 and 445 is disposed in the lower surface of the second substrate 350, the opening of the first and second light transmitting members 440 and 445 may be disposed in the reflective member 374. In this case, a size of the first surface may be less than that of the second surface.

In example embodiments, the OLED device may not include a transflective layer, but not being limited thereto. In some example embodiments, the OLED device may include the transflective layer disposed on the first and second light transmitting members 440 and 445 and the reflective member 374.

Figure 17:
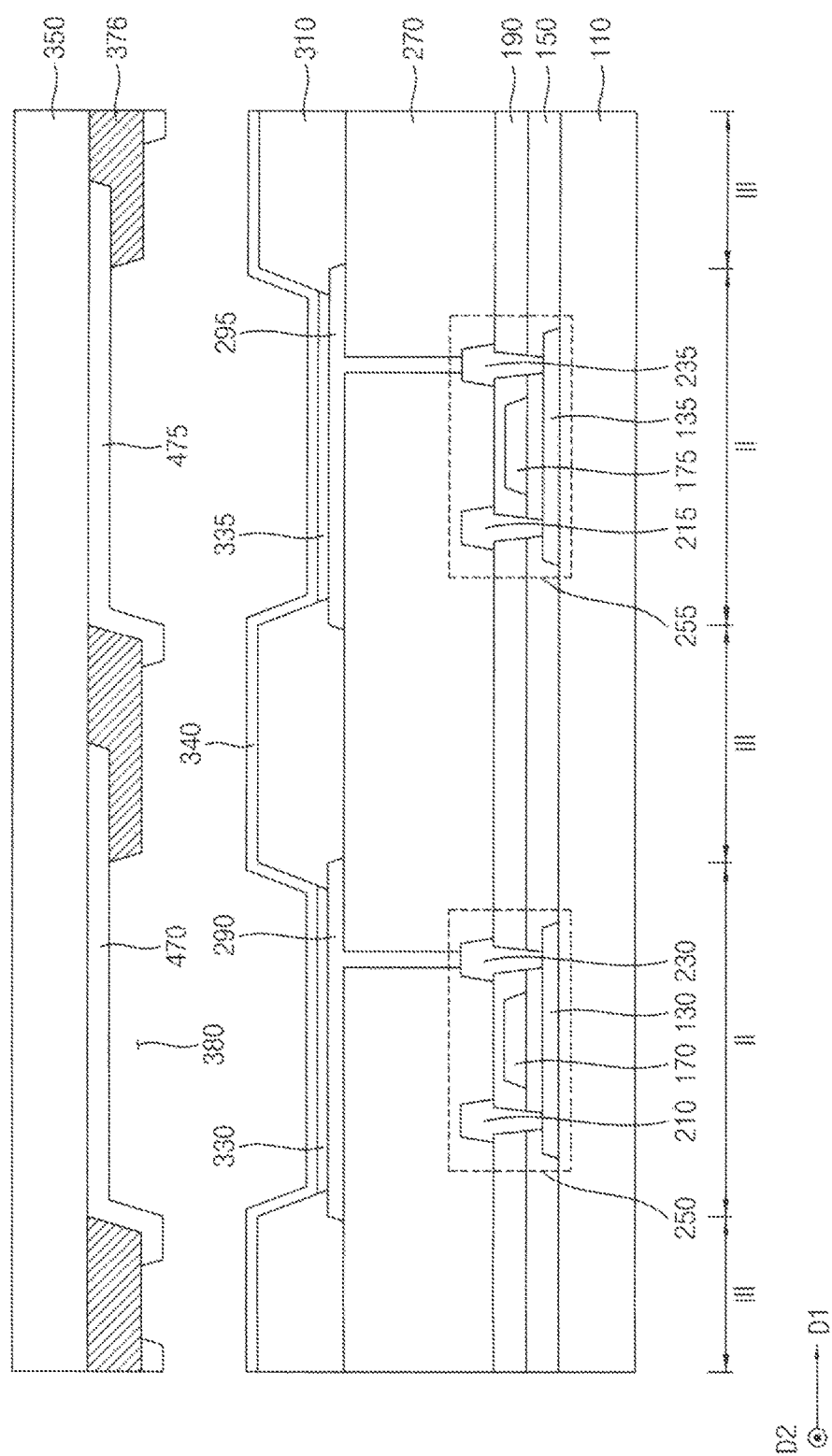
FIG. 17 is a cross-sectional view illustrating the OLED device in accordance with example embodiments.

FIG. 17 is a cross-sectional view illustrating the OLED device in accordance with example embodiments. An OLED device illustrated in FIG. 17 may have a configuration substantially the same as or similar to that of an OLED device 100 described with reference to FIG. 2 except first and second light transmitting members 470 and 475 and a reflective member 376. In FIG. 17, detailed descriptions for elements, which are substantially the same as or similar to the elements described with reference to FIG. 2, will be omitted.

Referring to FIG. 17, an OLED device may include a first substrate 110, a gate insulating layer 150, an insulating interlayer 190, a planarization layer 270, first and second pixel structures, a pixel defining layer 310, a second substrate 350, a reflective member 376, first and second light transmitting members 470 and 475, etc.

The reflective member 376 may include a first surface and a second surface that is opposite to the first surface. The first surface may face the second substrate 350, and the second surface may face the upper electrode 340.

A first side of the first light transmitting member 470 may be disposed on the second surface of the reflective member 376 such that the first light transmitting member 470 overlaps at least a portion of the reflective member 376 surrounding the first light transmitting member 470. In addition, a second side of the first light transmitting member 470 may be interposed between the first surface of the reflective member 376 and the second substrate 350. In similar, a first side of the second light transmitting member 475 may be disposed on the second surface of the reflective member 376 such that the second light transmitting member 475 overlaps at least a portion of the reflective member 376 surrounding the first light transmitting member 475. In addition, a second side of the second light transmitting member 475 may be interposed between the first surface of the reflective member 376 and the second substrate 350.

In this case, since the first and second light transmitting members 470 and 475 have a predetermined color, a color of a portion of the reflective member 376 (e.g., a portion where the first light transmitting member 470 overlaps the second light transmitting member 475) may be substantially the same as a color of the first and second light transmitting members 470 and 475. Accordingly, as the OLED device includes the first and second light transmitting members 470 and 475, the OLED device may serve as mirror display device having various colors.

In example embodiments, the OLED device may not include a transflective layer, but not being limited thereto. In some example embodiments, the OLED device may include the transflective layer disposed on the first and second light transmitting members 470 and 475 and the reflective member 376.

Figure 18:
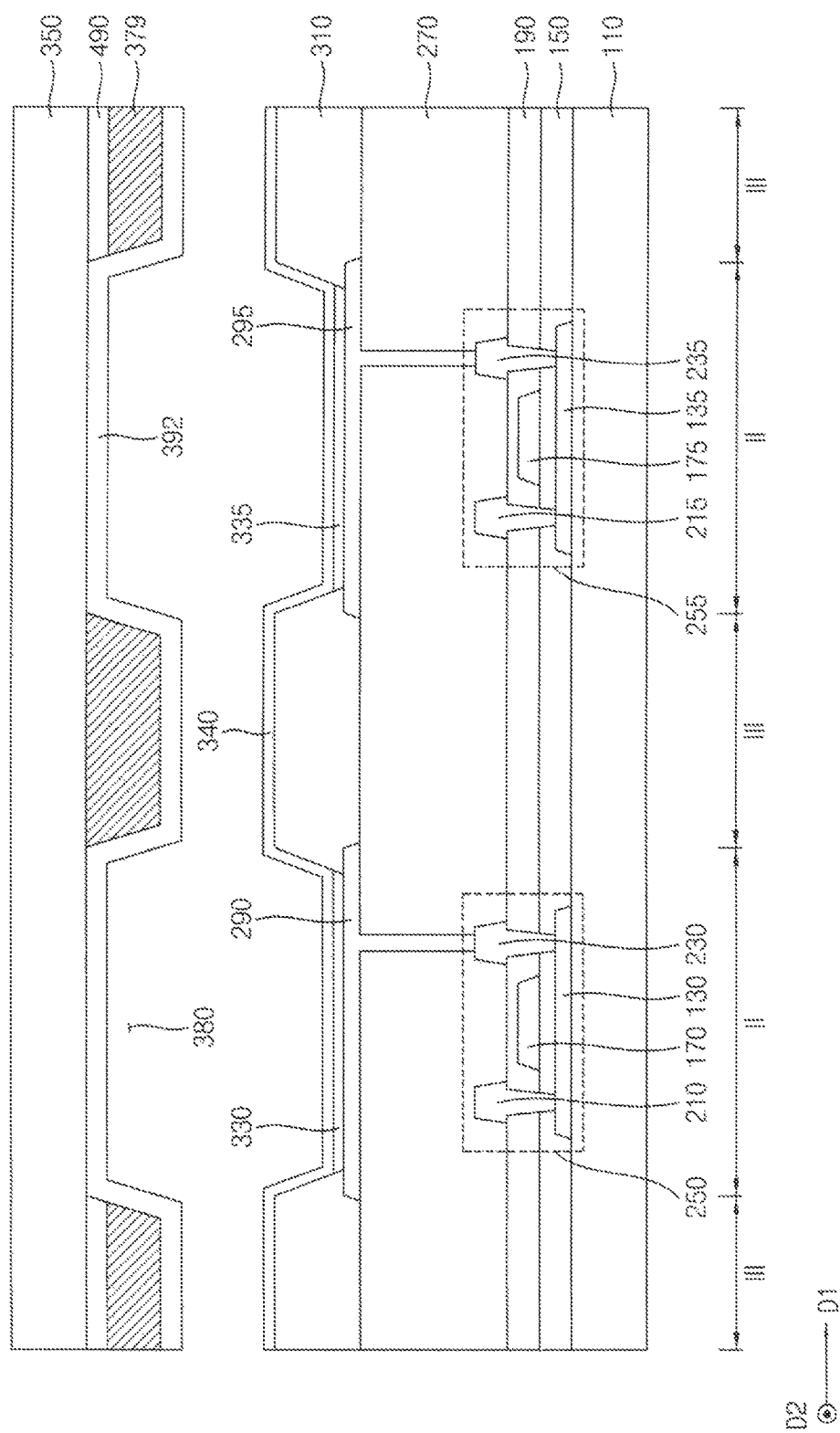
FIG. 18 is a cross-sectional view illustrating the OLED device in accordance with example embodiments.
Figure 19:
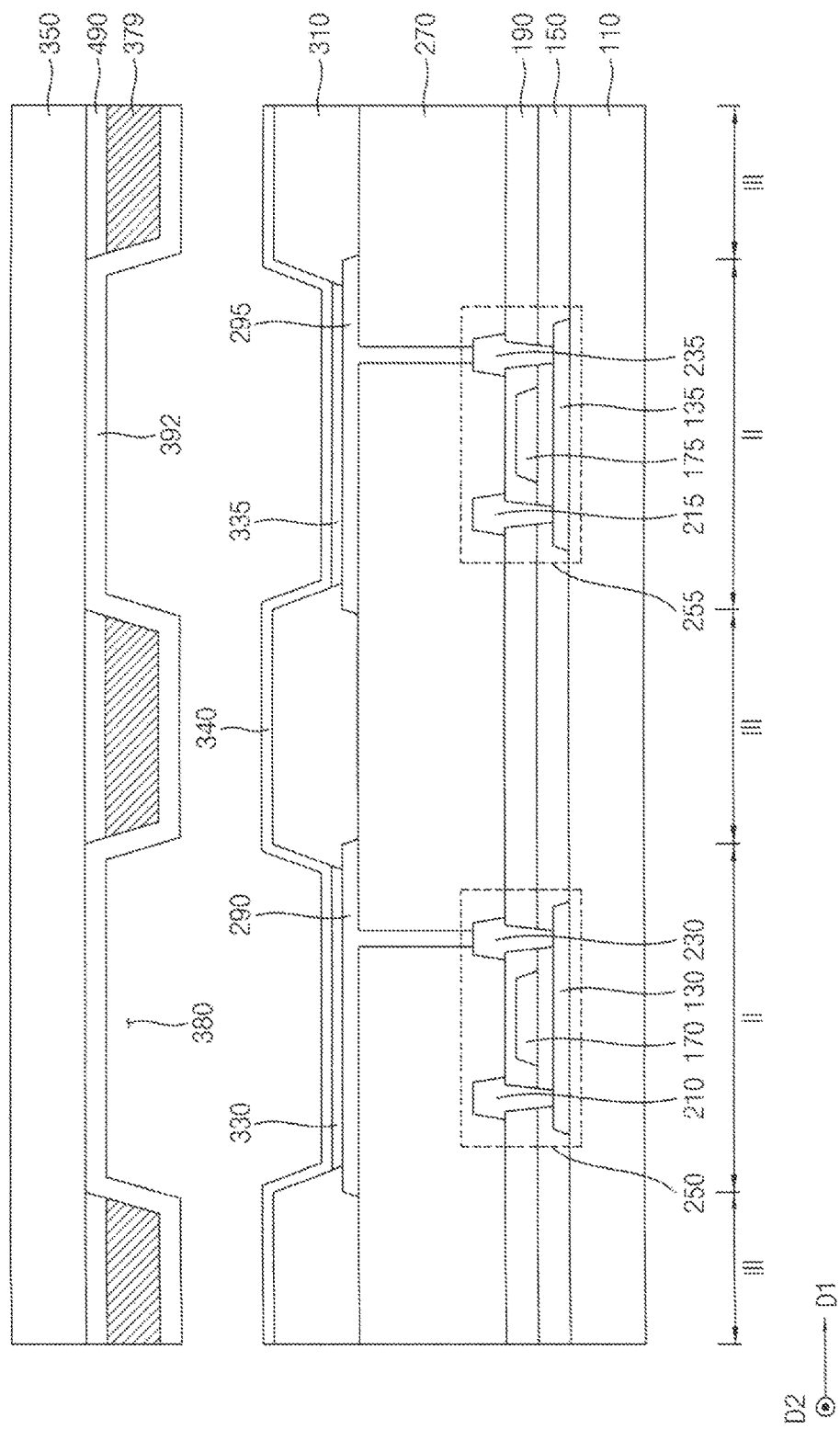
FIG. 19 is a cross-sectional view illustrating the OLED device in accordance with example embodiments.

FIG. 18 is a cross-sectional view illustrating the OLED device in accordance with example embodiments, and FIG. 19 is a cross-sectional view illustrating the OLED device in accordance with example embodiments. An OLED device illustrated in FIGS. 18 and 19 may have a configuration substantially the same as or similar to that of an OLED device 100 described with reference to FIG. 2 except a transflective layer 392 and a color layer 490. In FIGS. 18 and 19, detailed descriptions for elements, which are substantially the same as or similar to the elements described with reference to FIG. 2, will be omitted.

Referring FIG. 18, an OLED device may include a first substrate 110, first and second semiconductor elements 250 and 255, a gate insulating layer 150, an insulating interlayer 190, a planarization layer 270, first and second pixel structures, a pixel defining layer 310, a second substrate 350, a reflective member 379, a transflective layer 392, a color layer 490, etc. Here, each of the first and second pixel structures may include first and second lower electrodes 290 and 295, first and second light emitting layer 330 and 335, an upper electrode 340. Each of the first and second semiconductor elements 250 and 255 may include first and second active layers 130 and 135, first and second gate electrodes 170 and 175, first and second source electrodes 210 and 215, and first and second drain electrodes 230 and 235.

The OLED device may include a plurality of pixel regions. One pixel region among a plurality of the pixel regions may have a sub-pixel region II and a reflective region III. The first and second semiconductor elements 250 and 255, the first and second lower electrodes 290 and 295, the first and second light emitting layers 330 and 335, etc may be disposed in the sub-pixel region II. The pixel defining layer 310, the reflective member 379, the color layer 490, etc may be disposed in the reflective region III. In example embodiments, the color layer 490 may be disposed between the second substrate 350 and the reflective member 379, and may have a predetermined color. In addition, the transflective layer 392 may be disposed on the entire second substrate 350 and the entire reflective member 379.

For example, a display image may be displayed in the sub-pixel region II, and an image of an object that is disposed in the front of the OLED device may be reflected in the reflective region III. As the OLED device includes the reflective member 379, the color layer 490, and the transflective layer 392, the OLED device may serve as a mirror display device having various colors.

The reflective member 379 may include a first surface and a second surface that is opposite to the first surface. The first surface may be in contact with the color layer 490, and the second surface may be in contact with the transflective layer 392. A light incident through the second substrate 350 and the color layer 490 from an outside may be reflected from the first surface of the reflective member 379 (e.g., an image of an object that is disposed in the front of the OLED device 100 is displayed on the first surface of the reflective member 379.). In addition, a light generated from the first and second light emitting layers 330 and 335 of the OLED device may pass through the openings 380 disposed in the sub-pixel region II. The reflective member 379 may include a material that has relatively high reflective index. For example, the reflective member 379 may be formed of Au, Ag, Al, Pt, Ni, Ti, etc. Alternatively, the reflective member 370 may be formed of a metal, a metal alloy, metal nitride, conductive metal oxide, transparent conductive materials, etc. For example, the reflective member 370 may be formed of an alloy of aluminum, AlNx, an alloy of silver, WNx, an alloy of copper, CrNx, an alloy of molybdenum, TiNx, TaNx, SRO, ZnOx, SnOx, InOx, GaOx, ITO, IZO, etc.

The transflective layer 392 may cover the second substrate 350 and the reflective member 379 on the second substrate 350 and the reflective member 379, and may extend on a lower surface of the second substrate 350 in a first direction from the sub-pixel region II into the reflective region III. That is, the transflective layer 392 may be disposed on the entire second substrate 350 and the entire reflective member 379.

The transflective layer 392 may transmit a portion of a light and may reflect a remaining portion of the light. For example, a thickness of the transflective layer 392 may be less than that of the reflective member 379, and a light transmissivity of the transflective layer 392 may be greater than that of the reflective member 379. In addition, the transflective layer 392 may prevent a diffraction phenomenon of light generated from the reflective member 379 having a plurality of openings. Accordingly, the OLED device may serve as a mirror display device that visibility of the OLED device is improved. For example, the transflective layer 392 may be formed of Au, Ag, Al, Pt, Ni, Ti, etc. Alternatively, the transflective layer 392 may be formed of a metal, a metal alloy, metal nitride, conductive metal oxide, transparent conductive materials, etc.

The color layer 490 may be disposed in the reflective region III between the second substrate 350 and the reflective member 379. The color layer 490 may have a predetermined color. For example, the color layer 490 may include a pigment and/or dye. The pigment that is used in the color layer 490 may include azo lake organic pigments, quinacridone organic pigments, phthalocyanine organic pigments, isoindoline organic pigments, anthraquinone organic pigments, thioindigo organic pigments, chrome yellow, chrome blue, iron oxide, chrome vermilion, chrome green, ultramarine, emerald green, titanium white, carbon black, etc. These may be used alone or in a combination thereof. The dye that is used in the color layer 490 may include azo dyes, anthraquinone dyes, benzodifuranone dyes, condensed methane dyes, etc. These may be used alone or in a combination thereof. As the color layer 490 may include at least one selected from the pigments and/or the dyes, the color layer 490 may have the predetermined color.

In example embodiments, as illustrated in FIG. 18, the reflective region III included in a plurality of the pixel regions may include a first reflective region and a second reflective region that is adjacent to the first reflective region. Here, the color layer 490 may be disposed in the first reflective region, and the color layer 490 may not be disposed in the second reflective region. As a result, the OLED device may serve as a mirror display device having a color in the first reflective region.

In some example embodiments, as illustrated in FIG. 19, the reflective region III included in a plurality of the pixel regions may include a first reflective region and a second reflective region that is adjacent to the first reflective region. In addition, the color layer 490 may include a first color layer and a second color layer that is different from a color of the first color layer. The first color layer may be disposed in the first reflective region, and the second color layer may not be disposed in the second reflective region. As a result, the OLED device may serve as a mirror display device having two colors in a plurality of the pixel regions.

Accordingly, as the OLED device includes the reflective member 379, the transflective layer 392, and the color layer 490, the OLED device may serve as a mirror display device having various colors.

The present invention may be applied to various display devices including an OLED device. For example, the present invention may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display (OLED) device, comprising:
    a first substrate including a plurality of pixel regions, each of the pixel regions having sub-pixel regions and a reflective region surrounding the sub-pixel regions;
    a pixel structure in each of the sub-pixel regions on the first substrate;
    a second substrate on the pixel structure;
    a reflective member having an opening disposed in each of the sub-pixel regions, the reflective member being in the reflective region of the second substrate; and
    a color layer between the reflective member and the second substrate, the color layer having a predetermined color.

2. The OLED device of claim 1, further comprising:
    a transflective layer covering the second substrate and the reflective member,
    wherein the transflective layer is disposed in the sub-pixel region and the reflective region on the second substrate, and wherein a thickness of the transflective layer is less than a thickness of the reflective member, and a light transmissivity of the transflective member is greater than a light transmissivity of the reflective member.

3. The OLED device of claim 1, wherein the reflective region included in a plurality of the pixel regions includes a first reflective region and a second reflective region that is adjacent to the first reflective region, and
    wherein a color layer is disposed in the first reflective region, and is not disposed in the second reflective region.

4. The OLED device of claim 1, wherein the reflective region included in a plurality of the pixel regions includes a first reflective region and a second reflective region that is adjacent to the first reflective region, and the color layer includes a first color layer and a second color layer that is different from a color of the first color layer, and
    wherein a first color layer is disposed in the first reflective region, and the second color layer is disposed in the second reflective region.

* * * * *